(12) United States Patent
Kim

(10) Patent No.: US 9,006,078 B2
(45) Date of Patent: Apr. 14, 2015

(54) SEMICONDUCTOR DEVICE WITH AIR GAP AND METHOD OF FABRICATING THE SAME

(71) Applicant: SK Hynix Inc., Gyeonggi-do (KR)

(72) Inventor: Myung-Ok Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/015,423

(22) Filed: Aug. 30, 2013

(65) Prior Publication Data

US 2014/0306351 A1 Oct. 16, 2014

(30) Foreign Application Priority Data

Apr. 16, 2013 (KR) .................. 10-2013-0041584

(51) Int. Cl.
| | |
|---|---|
| H01L 21/76 | (2006.01) |
| H01L 21/4763 | (2006.01) |
| H01L 21/768 | (2006.01) |
| H01L 23/522 | (2006.01) |
| H01L 21/764 | (2006.01) |
| H01L 27/108 | (2006.01) |

(52) U.S. Cl.
CPC ...... *H01L 21/76855* (2013.01); *H01L 23/5222* (2013.01); *H01L 21/764* (2013.01); *H01L 27/10855* (2013.01); *H01L 27/10885* (2013.01); *H01L 27/10888* (2013.01)

(58) Field of Classification Search
CPC ............ H01L 21/764; H01L 21/76855; H01L 23/5226; H01L 27/10855; H01L 27/10885; H01L 27/10888

USPC ......... 438/421, 422, 619, 637, 639, 653, 672, 438/675, 700
See application file for complete search history.

(56) References Cited

U.S. PATENT DOCUMENTS

| | | | | |
|---|---|---|---|---|
| 6,812,113 | B1 * | 11/2004 | Alieu et al. ................... | 438/421 |
| 6,995,073 | B2 * | 2/2006 | Liou ............................. | 438/421 |
| 8,399,335 | B2 * | 3/2013 | Huisinga et al. ............. | 438/421 |
| 2011/0260220 | A1 | 10/2011 | Chi et al. | |
| 2012/0193696 | A1 | 8/2012 | Fukushima | |

FOREIGN PATENT DOCUMENTS

KR 1020020094977 12/2002

* cited by examiner

*Primary Examiner* — Hung Vu
(74) *Attorney, Agent, or Firm* — IP & T Group LLP

(57) ABSTRACT

A method of fabricating a semiconductor device and a semiconductor device formed by the method. The method includes form a stack conductive structure by stacking a first conductive pattern and an insulation pattern over a substrate; forming a sacrificial pattern over sidewalls of the stack conductive structure; forming a second conductive pattern having a recessed surface lower than a top surface of the stack conductive structure; forming a sacrificial spacer to expose sidewalls of the insulation pattern by removing an upper portion of the sacrificial pattern; reducing a width of the exposed portion of the insulation patters; forming a capping spacer to cap the sidewalls of the insulation pattern having the reduced width over the sacrificial spacer; and forming an air gap between the first conductive pattern and the second conductive pattern by converting the sacrificial spacer to volatile byproducts.

10 Claims, 24 Drawing Sheets

SEMICONDUCTOR DEVICE WITH AIR GAP AND METHOD OF FABRICATING THE SAME

CROSS-REFERENCE TO RELATED APPLICATIONS

The present application claims priority of Korean Patent Application No. 10-2013-0041584, filed on Apr. 16, 2013, which is incorporated herein by reference in its entirety.

BACKGROUND

1. Field

Exemplary implementations of the present invention relate to a semiconductor device, and more particularly, to a semiconductor device with an air gap and a method of fabricating the same.

2. Description of the Related Art

In general, a semiconductor device may include, for example, conductive structures formed with insulating a material provided therebetween. With an increase in the of integration of semiconductor devices, a distance between the conductive structures has gradually decreased. Accordingly, parasitic capacitance between the conductive structures has increased. With the increase of parasitic capacitance, an operation speed of the semiconductor device is degraded.

In order to reduce parasitic capacitance the dielectric constant of the insulating a material is reduced. However, there is a limitation in reducing parasitic capacitance since the insulating a material have a relatively high dielectric constant.

SUMMARY

Various exemplary implementations are directed to a semiconductor device that may reduce parasitic capacitance between adjacent conductive structures, and a method for fabricating the same.

An exemplary method of fabricating a semiconductor device includes forming a first conductive pattern over a substrate; forming an insulation pattern over first conductive pattern to form a conductive structure; forming a sacrificial pattern and a first insulating layer on the conductive structure; forming, adjacent to the first conductive pattern, a second conductive pattern having a top surface that is lower than a top surface of the first conductive structure; removing an upper portion of the sacrificial pattern to form a sacrificial spacer exposing a portion of the insulation pattern and removing an upper portion of the first insulating layer to form a passivation spacer exposing a portion of the insulation pattern; reducing a width of the exposed portion of the insulation pattern; capping the sacrificial spacer and the passivation spacer with a second spacer; and forming an air gap between the first conductive pattern and the second conductive pattern by converting the sacrificial spacer to a diffusible state.

An exemplary method of fabricating a semiconductor device includes forming an insulation layer over a substrate; forming an open portion in the insulation layer; forming a sacrificial spacer over sidewalls that define the open portion; forming a passivation spacer over the sacrificial spacer; forming a recessed conductive pattern in the open portion; trimming an upper portion of the sidewalls that define the open portion; forming a capping spacer to cap the sacrificial spacer and the passivation spacer; and forming an air gap between the recessed conductive pattern over and the sidewalls that define the open portion by converting the sacrificial spacer to a volatilized state.

An exemplary method for fabricating a semiconductor device includes forming, over a substrate, a plurality of bit line structures, each including a stacked bit line and a hard mask pattern; forming an inter-layer insulation layer over the plurality of bit line structures; forming, by etching the inter-layer insulation layer, a contact hole between the plurality of bit line structures; forming a carbon-containing spacer on sidewalls, of the plurality of bit line structures, that define the contact hole; forming a first plug in the contact hole to form a recess plug structure, including the carbon-containing spacer, wherein the carbon-containing spacer is located between the first plug and the sidewalls, of the plurality of bit line structures, that define the contact hole; removing the carbon-containing spacer to expose sidewalls of the hard mask pattern; reducing a thickness of the exposed the sidewalls of the hard mask pattern; forming a capping spacer to cap the carbon-containing spacer and the reduced thickness sidewalls of the hard mask pattern; and forming an air gap between the bit line and the first plug by converting the carbon-containing spacer to a volatile form.

An exemplary semiconductor device includes a bit line structure formed over a substrate, the bit line structure including a bit line and a hard mask pattern, wherein the hard mask pattern has a width smaller than a width of the bit line; a bit line spacer formed over sidewalls of the bit line; a first plug formed adjacent to the sidewalls of the bit line and separated from the bit line by an air gap; and a capping spacer formed over the sidewalls of the hard mask pattern and the bit lines pacer to cap the air gap.

DETAILED DESCRIPTION

Figure 1:
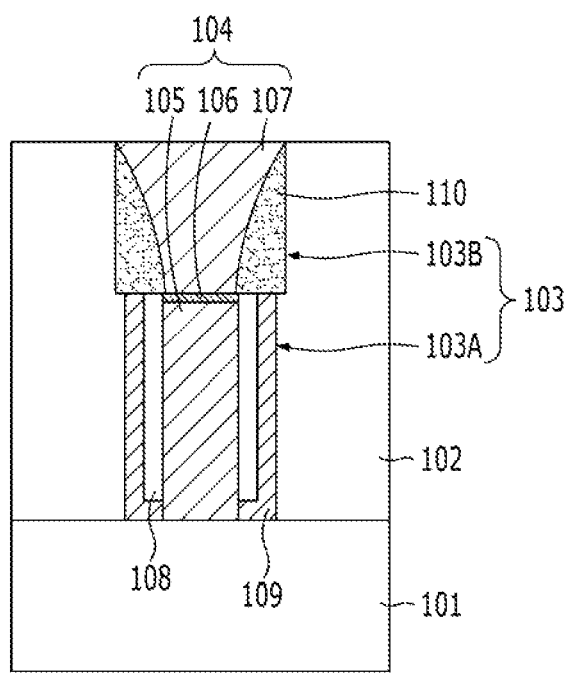
FIG. 1 is a cross sectional view illustrating an exemplary semiconductor device.

Various exemplary implementations of the present invention will be described below in more detail with reference to the accompanying drawings. The present invention may, however, be embodied in different forms and should not be construed as limited to the exemplary implementations set forth herein. Rather, these exemplary implementations are provided so that this disclosure will be thorough and complete, and will fully convey the scope of the present invention to those skilled in the art. Throughout the disclosure, reference numerals correspond directly to the like numbered parts in the various figures and exemplary implementations of the present invention.

The drawings are not necessarily to scale and in some instances, proportions may have been exaggerated in order to clearly illustrate features of the implementations. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

FIG. 1 is a cross sectional view illustrating an exemplary semiconductor device.

Referring to FIG. 1, an insulation layer 102 is formed over a substrate 101. An open portion 103 is formed in the insulation layer 102. The open portion 103 may include, for example, a first open portion 103A and a second open portion 103B. The first open portion 103A exposes a part of a surface of the substrate 101. The second open portion 103B is formed over the first open portion 103A. A width of the second open portion 103B may be greater than a width of the first open portion 103A. A conductive structure 104 is formed in the open portion 103. The conductive structure 104 may include a first conductive pattern 105 and a second conductive pattern 107. The second conductive pattern 107 is formed over the first conductive pattern 105. A third conductive pattern 106 is formed between the first conductive pattern 105 and the second conductive pattern 107. The third conductive pattern 106 is an ohmic contact layer. The first conductive pattern 105 is formed in the first open portion 103A. The second conductive pattern 107 is formed in the second open portion 103B. An air gap 108 is formed between the first conductive pattern 105 and sidewalls that define the first open portion 103A. A first spacer 109 is formed over the sidewalls that define the first open portion 103A. The air gap 108 is formed between the first spacer 109 and the first conductive pattern 105. A second spacer 110 is formed over the air gap 108 and the first spacer 109. The second spacer 110 is formed over sidewalls that define the second open portion 103B to cap the air gap 108 and the first spacer 109.

The substrate 101 may include, for example, for example, a silicon substrate, a silicon germanium substrate, the like. Furthermore, the substrate 101 may include, for example, a silicon-on-insulator (SOI) substrate. The insulation layer 102 may include, for example, a material having a low dielectric constant, such as silicon nitride, silicon oxide, or the like. The insulation layer 102 may include, for example, an inter-layer insulation layer.

The open portion 103 is formed to be a hole shape or a line shape. For example, the open portion 103 may be a contact hole, a via hole, a through hole, a trench, a recess, or the like. The first open portion 103A and the second open portion 103B may include, for example, the through hole. One of the first open portion 103A or the second open portion 103B may include, for example, the through hole, and the other may have the line shape. If the open portion 103 is a contact hole, then the conductive structure 104 is a contact plug.

The first conductive pattern 105 may include, for example, a silicon-containing material, a metal-containing material, or the like. The second conductive pattern 107 may include, for example for example, a silicon-containing material, a metal-containing material, or the like. The first conductive pattern 105 and the second conductive pattern 107 may include, for example, polysilicon, a metal, a metal nitride, a metal silicide, a metal carbide, or the like. The first conductive pattern 105 and the second conductive pattern 107 may include, for example the same conductive material or may include, for example, different conductive a material from each other. For example, the first conductive pattern 105 may include, for example, a silicon-containing material, and the second conductive pattern 107 may include, for example a metal-containing material. Alternatively, the first conductive pattern 105 may include, for example, a metal-containing material and the second conductive pattern 107 may include, for example, a silicon-containing material. If a silicon-containing first conductive pattern 105 contacts a metal-containing second conductive pattern 107, then an ohmic contact may be required. The third conductive pattern 106 may act as the ohmic contact layer. The third conductive pattern 106 may include, for example, a metal silicide. The third conductive pattern 106 may include, for example, cobalt silicide, titanium silicide, or the like.

The first spacer 109 and the second spacer 110 may include, for example, a material having a low dielectric constant. The material having a low dielectric constant may include, for example, an oxide or a nitride. The material having a low dielectric constant may include, for example, a silicon oxide, a silicon nitride, or a metal oxide. The first spacer 109 may include, for example, a material having a high density, and the second spacer 110 may include, for example, a material having a low density. The first spacer 109 may include, for example, a silicon nitride, and the second spacer 110 may include, for example, a silicon oxide. The silicon oxide may include, for example, $SiO_2$. The silicon nitride may include, for example, $Si_3N_4$, SiN or the like. The second spacer 110 may include, for example, a material having a low density silicon oxide. The low density silicon oxide is formed at a low temperature. A lower portion of the second spacer 110 is wide enough to cap the air gap 108.

The air gap 108 is formed by removing a sacrificial material through a conversion process. The sacrificial material is formed between the first spacer 109 and the first conductive pattern 105. After capping the sacrificial material using the second spacer 110 the conversion process is performed. It will be descried more detail in FIGS. 2A to 2G.

Shown as FIG. 1, the air gap 108 is stably capped by the second spacer 110. An electric insulating characteristic of the conductive structure 104 is improved since the air gap 108 insulates the conductive structure 104 from a certain conductive pattern which is disposed adjacent to the conductive structure 104. Also, if a certain conductive pattern is disposed adjacent to the first conductive pattern 105, then a parasitic capacitance between the certain conductive pattern and the first conductive pattern 105 is decreased.

Since the second spacer 110 is formed over the sidewalls that define the second open portion 103B, a thickness of the second spacer 110 will be thick enough to cap the air gap 108, so that the air gap 108 is stably protected by the second spacer 110. In addition, by enlarging an area to form the third conductive pattern 106, a contact resistance between the conductive structure 104 and the first conductive pattern 105 may be improved.

FIGS. 2A to 2G are cross sectional views illustrating an exemplary method of fabricating the semiconductor device of FIG. 1.

Figure 2A:
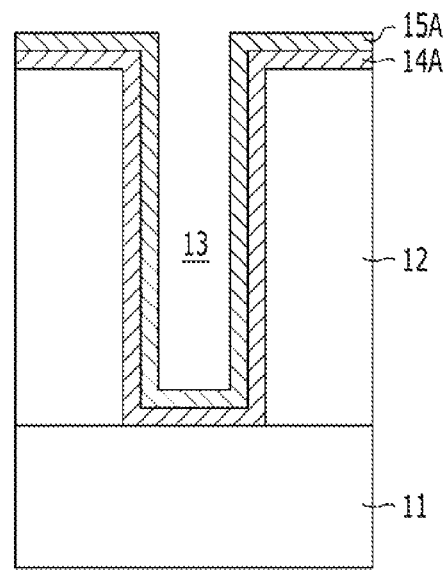
FIGS. 2A to 2G are cross sectional views illustrating an method of fabricating the exemplary semiconductor device of FIG. 1.

Referring to FIG. 2A, a first insulation layer 12 is formed over a substrate 11. The substrate 11 may include, for example, a semiconductor substrate. The substrate 11 may contain silicon. The substrate 11 may include, for example, a silicon substrate, a silicon germanium substrate, or the like. Furthermore, the substrate 11 may include, for example, a silicon-on-insulator (SOI) substrate. The first insulation layer 12 may include, for example, a low-k material, such as silicon nitride, silicon oxide, or the like.

An open portion 13 is formed in the first insulation layer 12. The open portion 13 is formed to expose a surface of the substrate 11 by etching the first insulation layer 12. The open portion 13 is formed to be a hole shape or a line shape. For example, the open portion 13 may be a contact hole, a via hole, a through hole, a trench, a recess, or the like. An open array may be formed by regularly arranging a plurality of open portions 13 at a certain interval. A mask pattern (not shown) may be used to etch the first insulation layer 12. The mask pattern may include, for example, a photoresist pattern, a hard mask pattern that is patterned by a photoresist pattern, or the like.

A second insulation layer 14A is formed over the entire surface of the resulting structure comprising the first insulation layer 12 and the open portion 13. The second insulation layer 14A may be conformally formed to have a thin thickness. The second insulation layer 14A may include, for example, a low-k material. The second insulation layer 14A may include, for example, a low-k material having a high density. The second insulation layer 14A may include, for example, silicon nitride.

A sacrificial layer 15A is formed over the second insulation layer 14A. The sacrificial layer 15A may be conformally formed to have a thin thickness. The sacrificial layer 15A may include, for example, a low-k material. The sacrificial layer 15A may include a material, volatile byproducts, diffused by a conversion process. The sacrificial layer 15A is formed at a temperature above at least 400° C. The dielectric constant of the sacrificial layer 15A has a value between a dielectric constant of air and a dielectric constant of $SiO_2$ ($K_{air} < K_{sacrificial\ layer} < K_{SiO2}$).

The sacrificial layer 15A may include, for example, a carbon-containing material. The sacrificial layer 15A may include, for example, an amorphous carbon.

Figure 2B:
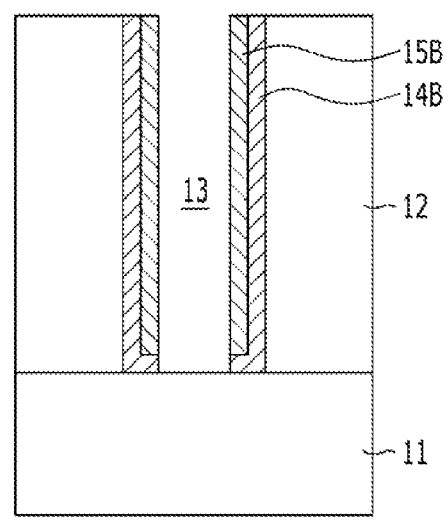

Referring to FIG. 2B, a dual spacer structure is formed over sidewalls that define the open portion 13. The double spacer structure may include, for example, a first spacer 14B and a sacrificial spacer 15B. The sacrificial spacer 15B may be formed by etching the sacrificial layer 15A, and the first spacer 14B may be formed by etching the second insulation layer 14A. An etch-back process may be used to etch the first spacer 14B and the sacrificial spacer 15B. By forming the first spacer 14B and the sacrificial spacer 15B, a surface of the substrate 11 is exposed through the open portion 13.

Figure 2C:
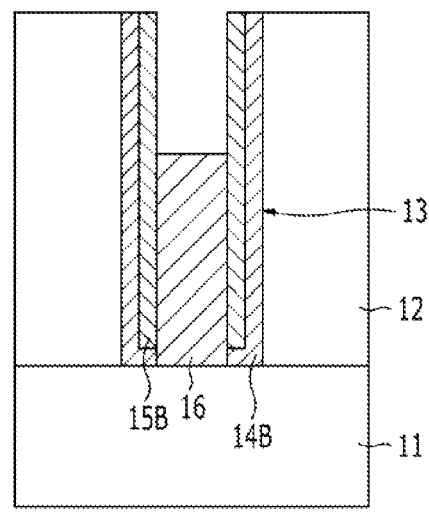

Referring to FIG. 2C, a first conductive pattern 16 is formed to fill the open portion 13. A first conductive layer (not shown) is formed over the first insulation layer 12 comprising the sacrificial spacer 15B. The first conductive layer is formed to fill the open portion 13 over the first insulation layer 12. The first conductive layer is formed at a low temperature below at least 400° C. Then, the first conductive layer may be selectively etched, thereby forming a first conductive pattern 16 recessed in the open portion 13. The first conductive pattern 16 may be formed by etching the first conductive layer until the first conductive layer is completely removed from a surface of the first insulation layer 12. The first conductive pattern 16 may include, for example, a silicon-containing material or a metal-containing material. The first conductive pattern 16 may include, for example, polysilicon, tungsten, titanium-nitride, a metal silicide, or the like. The first conductive pattern 16 is in contact with the surface of the substrate 11.

Figure 2D:
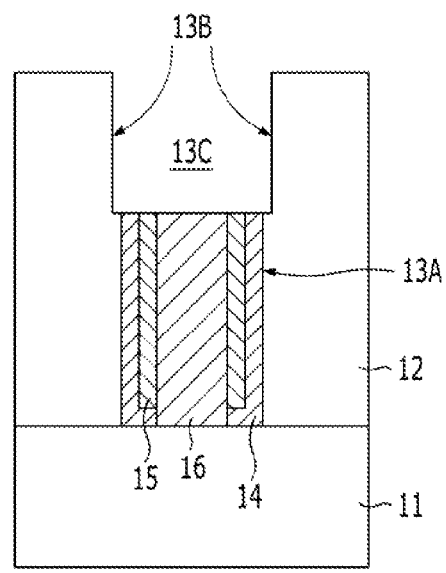

Referring to FIG. 2D, the sacrificial spacer 15B and the first spacer 14B, exposed over an upper portion of the first conductive pattern 16, are recessed to a certain depth by an isotropic etching process. Accordingly, the sacrificial spacer and the first spacer are represented by reference numeral "15" and "14," respectively.

By the isotropic etching process, a sacrificial spacer 15 is formed to surround the first conductive pattern 16. Upper surfaces of the sacrificial spacer 15 and the first spacer 14 are aligned to an upper surface of the first conductive pattern 16.

By the isotropic etching process, sidewalls that define an upper portion of the open portion 13 are exposed. The exposed sidewalls that define an upper portion of the open portion 13 are exposed sidewalls 13B. A portion remained of a recessed structure is in a first open portion 13A.

Then, a trimming process may be performed on the exposed sidewalls 13B. The trimming process may be performed by an isotropic etching process. A line width 13B of the first open portion 13 is increased by the trimming process. A second open portion 13C is formed by trimming the exposed sidewalls 13B.

The open portion 13 has a dual structure comprising the first open portion 13A and the second open portion 13C. A width of the second open portion 13C is greater than a width of the first open portion 13A. A recess structure is formed in the first open portion 13A. An upper portion of the recess structure is exposed by the second open portion 13C. The recess structure may include, for example, the first conductive pattern 16, the sacrificial spacer 15 and the first spacer 14.

An etch-back process is applied to recess the first conductive pattern 16A and the sacrificial spacer 15B.

Figure 2E:
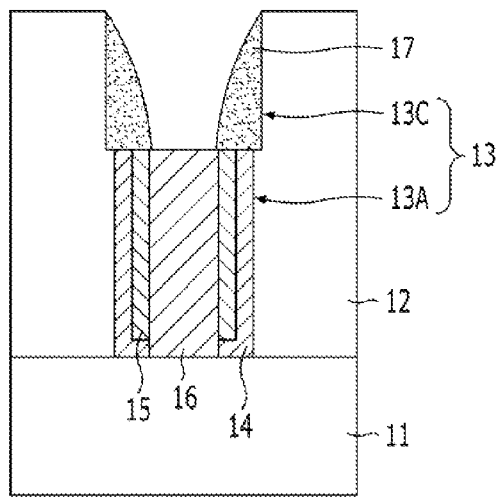

Referring to FIG. 2E, a second spacer 17 is formed. The second spacer 17 may be formed by etching a third insulation layer (not shown). The third insulation layer is formed over the first insulation layer 12 and in the second open portion 13C. The third insulation layer may include, for example, a material having a low dielectric constant of a low density. Generally, the low dielectric constant is below 3 and the high dielectric constant is above 7. The third insulation layer may include, for example, a porous dielectric material. The third insulation layer may include, for example, a silicon oxide, a silicon oxide having a low density, or the like. Since the silicon oxide having a low density is volatile byproducts, it is easily diffused by the conversion process. The silicon oxide having a low density may be formed by a low temperature CVD. Since the third insulation layer is formed at a low temperature below at least 400° C., the third insulation layer has a low density. Since the third insulation layer may include, for example, a material having a low density, it is capable of being diffused by oxygen plasma in a plasma stripper. The third insulation layer may be etched to form the second spacer 17. The third insulation layer may be etched by etch-back process.

The second spacer 17 has a thickness sufficient to cap an upper portion of the sacrificial spacer 15. The second spacer 17 is formed to expose the upper portion of the first conductive pattern 16. The second spacer 17 is formed to cap the upper portions of the sacrificial spacer 15 and the first spacer 14, and to expose the upper portion of the first conductive pattern 16.

The first spacer 14 and the sacrificial spacer 15 are formed over the sidewalls that define the first open portion 13A. The second spacer 17 is formed over the sidewalls that define the second open portion 13C. The second spacer 17 covers the upper portions of the first spacer 14 and the sacrificial spacer 15. The sacrificial spacer 15 may not exposed since the second spacer 17, the first spacer 14 and the first conductive pattern 16 surround the sacrificial spacer 15.

Figure 2F:
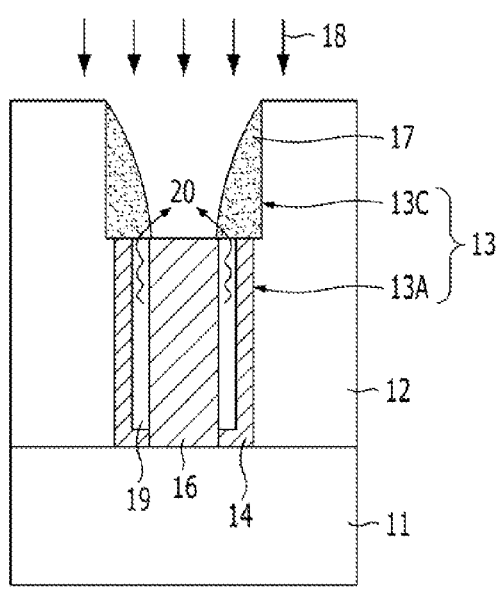

Referring to FIG. 2F, the sacrificial spacer 15 is removed, To remove the sacrificial spacer 15, a conversion process 18 is performed. The sacrificial spacer 15 is turned into volatile byproducts 20 by the conversion process 18. The conversion process 18 may include, for example, a decomposition process, a phase change process, or the like. The decomposition process and the phase change process turn a solid into volatile byproducts 20, such as a vapor or a gas. The volatile byproducts 20 are easily removed by diffusing through the second spacer 17. Since a density of the second spacer 17 is low, the volatile byproducts 20 are easily diffused through the second spacer.

If the sacrificial spacer 15 includes, for example, an amorphous carbon, then the conversion process 18 may include, for example, an oxidation reaction process, such as an $O_2$ plasma treatment process. The $O_2$ plasma treatment process may be performed using a plasma stripper. The amorphous carbon may be oxidized by the $O_2$ plasma treatment process, and thus, converted into a vapor or a gas. For example, when the $O_2$ plasma permeates the amorphous carbon through the second spacer 17, the amorphous carbon is oxidized into the volatile byproducts 20, such as carbon dioxide $CO_2$. The volatile byproducts 20 are diffused through the second spacer 17. The low density material of the second spacer 17 allows the $O_2$ plasma to permeate through the second spacer 17, and allows the volatile byproducts 20 to diffuse out through the second spacer 17. On the other hand, the first spacer 14 blocks the volatile byproducts 20 from being diffused. Since the first spacer 14 may include, for example, a high density material, diffusion of the volatile byproducts 20 is blocked by the first spacer 14. That is, the first spacer 14 acts as a passivation spacer for blocking the diffusion of the volatile byproducts 20.

As the sacrificial spacer 15 is removed by the conversion process 18, a space occupied by the sacrificial spacer 15 becomes an air gap 19. Since the air gap 19 is capped by the second spacer 17, the air gap 19 is stably capped even though the sacrificial spacer 15 is removed. The second spacer 17 acts as a capping spacer. A parasitic capacitance between adjacent conductive structures is reduced by the air gap 19. The air gap 19 is formed between the first conductive pattern 16 and the first spacer 14.

The air gap 19 is formed by removing the sacrificial spacer 15 through the conversion process 18. Thus, the sacrificial spacer 15 is removed without using an etching process, such as a wet etching process.

As described above, since the air gap 19 is formed without using an etching process, a loss to surrounding structures that would be caused by the etching process is prevented. Also, the sacrificial spacer 15 is removed without a residue by the conversion process 18. Also, since the air gap 19 is formed after the second spacer 17 is formed, a capping efficiency of the air gap 19 is increased. Also, the second spacer 17 prevents an exposure of the air gap 19 and a flowing of a conductive material in to the air gap 19.

Figure 2G:
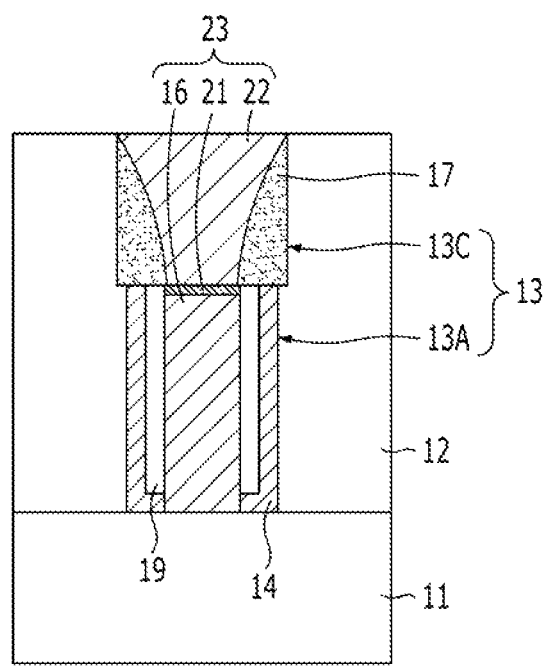

Referring to FIG. 2G, a second conductive pattern 22 is formed over a first conductive pattern 16. The second conductive pattern 22 fills the second open portion 13C having the second spacer 17. The second conductive pattern 22 may include, for example, a metal-containing layer. The second conductive pattern 22 may include, for example, a tungsten layer. The second conductive pattern 22 may include, for example, a tungsten layer. The second conductive pattern 22 may include, for example, a stacked structure including a barrier layer and a tungsten layer. The barrier layer may include, for example, a stacked structure of a titanium layer and a titanium nitride layer.

A third conductive pattern 21 is formed over the first conductive pattern 16 and the second conductive pattern 22. The third conductive pattern 21 may form an ohmic contact between the first conductive pattern 16 and the second conductive pattern 22. The third conductive pattern 21 may include, for example, a metal silicide. The third conductive pattern 21 may include, for example, a cobalt silicide. To form the cobalt silicide, an annealing process may be performed after a cobalt layer is deposited over the first conductive pattern 16. Alternatively, a cobalt silicide may be directly deposited over the first conductive pattern 16. The deposited cobalt silicide may be simultaneously formed between the first conductive pattern 16 and the second conductive pattern 22 and between the second spacer 17 and the second conductive pattern 22.

A conductive structure 23, which includes the first conductive pattern 16, the third conductive pattern 21 and the second conductive pattern 22, is formed. The air gap 19 and the first spacer 14 are formed between the first conductive pattern 16 and sidewalls that define the first open region 13A. The second spacer 17 is formed between the second conductive pattern 22 and sidewalls that define the second open region 13C. The second spacer 17 caps the air gap 19 and the first spacer 14

The conductive structure 23 may become a contact plug, an electrode, or the like by subsequent processes. Further, conductive structure 23 may become a bit line, a metal interconnection, a gate electrode, a word line, or the like by a subsequent process.

Since the second spacer 17 is formed over the sidewalls that define the second open portion 13C, a thickness of the second spacer 17 is sufficient to cap the air gap 19, so that the air gap 19 is stably protected by the second spacer 17. In addition, by enlarging an area to form the third conductive pattern 21, a contact resistance between the first conductive pattern 16 and the second conductive pattern 22 may be improved.

Figure 3:
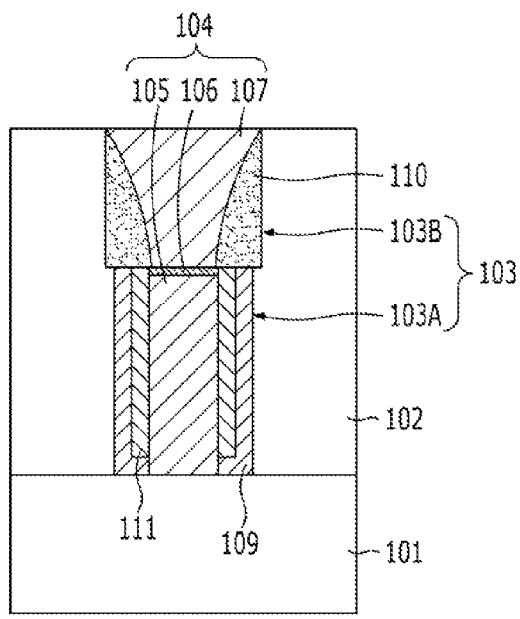
FIG. 3 is a modification of the exemplary semiconductor device shown in FIG. 1.

FIG. 3 shows a modification of the exemplary semiconductor device shown in FIG. 1.

Referring to FIG. 3, an insulation layer 102 is formed over a substrate 101. An open portion 103 is formed in the insulation layer 102. The open portion 103 may include, for example, a first open portion 103A and a second open portion 103B. The first open portion 103A exposes a part of a surface of the substrate 101. The second open portion 103B is formed over the first open portion 103A. A width of the second open portion 103B may be greater than a width of the first open portion 103A. A conductive structure 104 is formed in the open portion 103. The conductive structure 104 may include, for example, a first conductive pattern 105 and a second conductive pattern 107. The second conductive pattern 107 is formed over the first conductive pattern 105. A third conductive pattern 106 is formed between the first conductive pattern 105 and the second conductive pattern 107. The third conductive pattern 106 may be an ohmic contact layer. The first conductive pattern 105 is formed in the first open portion 103A. The second conductive pattern 107 is formed in the second open portion 103B.

A first spacer 109 is formed over the sidewalls that define the first open portion 103A. A third spacer 111 is formed between the first spacer 109 and the first conductive pattern 105. A second spacer 110 is formed over the third spacer 111 and the first spacer 109. The second spacer 110 is formed over sidewalls that define the second open portion 103B to cap the air gap 108 and the first spacer 109. An insulation structure, including a first spacer 109 and the third spacer 111, is formed between the first conductive pattern 105 and the sidewalls that define the first open portion 103A. The third spacer 111 is formed between the first spacer 109 and the first conductive pattern 105. The second spacer 110 is formed over the third spacer 111 and the first spacer 109. The second spacer 110 is formed over sidewalls that define the second open region 103B to cap the third spacer 111 and the first spacer 109.

The third spacer 111 may include, for example, a material having a low dielectric constant. The third spacer 111 may include, for example, a material having a dielectric constant that is lower than a dielectric constant of the first spacer 109 and a dielectric constant of the third spacer 111. The dielectric constant of the third spacer 111 has value between a dielectric constant of air and a dielectric constant of $SiO_2$. For example, the third spacer 111 may include, for example, a carbon-containing material. The third spacer 111 may include, for example, an amorphous carbon. The dielectric constant of the amorphous carbon is lower than a dielectric constant of silicon oxide. The dielectric constant of $SiO_2$ is 3.9 and dielectric constant of the amorphous carbon is equal to or less than about 3. The dielectric constant of the amorphous carbon is controlled by a method for forming the amorphous carbon or by an impurity content of the amorphous carbon. For example, the dielectric constant of amorphous carbon containing hydrogen is equal to or less than about 2.1.

In FIG. 3, since the third spacer 111 is formed of the carbon-containing material having the low dielectric constant, a parasitic capacitance between two conductive patterns may be reduced between disposed adjacent to the first conductive pattern 105.

Since the second spacer 110 is formed over the sidewalls that define the second open portion 103B, a thickness of the second spacer 110 is sufficient to cap the third spacer 111, so that the third spacer 111 is stably protected by the second spacer 110. Since a width of the second open region 103B is sufficient to form the second conductive pattern 107 is secured even though the thickness of the second spacer 110 is thicker than prior to. In addition, by enlarging an area to form the third conductive pattern 21, a contact resistance may be improved.

Figure 4:
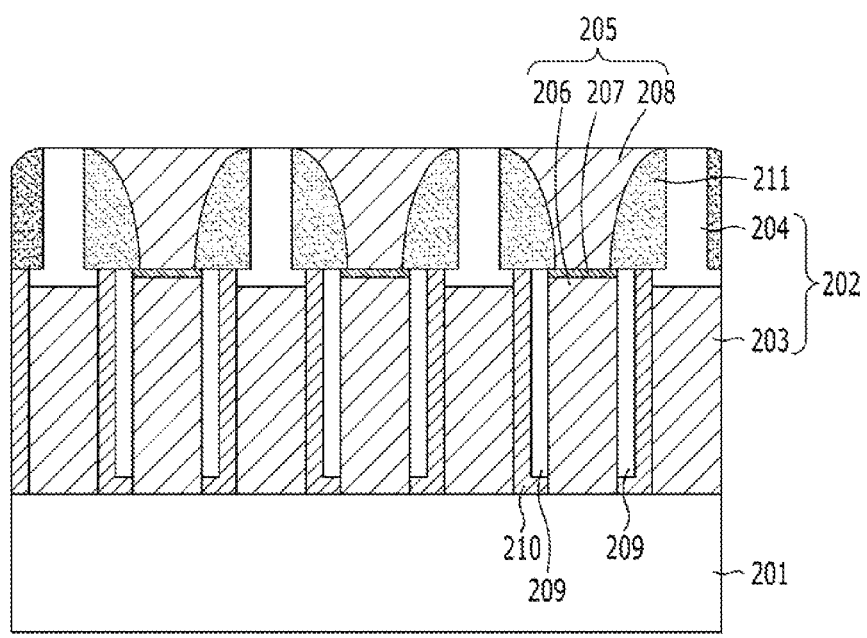
FIG. 4 is a cross sectional views illustrating an exemplary semiconductor device.

FIG. 4 is a cross sectional view illustrating an exemplary semiconductor device.

Referring to FIG. 4, a plurality of conductive structures are formed over a substrate 201. The conductive structures include a first conductive structure 202 and a second conductive structure 205. An insulation structure having an air gap 209 is formed between the first conductive structure 202 and the second conductive structure 205. A first spacer 210 is formed over the first conductive structure 202. The air gap 209 is formed between the first spacer 210 and the second conductive structure 205. A second spacer 211 is formed over the air gap 209 and the first spacer 210. Upper portions of the air gap 209 and the first spacer 210 are capped by the second spacer 211.

In detail, the substrate 201 may include, for example, a silicon substrate, a silicon germanium substrate, or the like. Furthermore, the substrate 101 may include, for example, a silicon-on-insulator (SOI) substrate.

The first conductive structure 202 may include, for example, a first conductive pattern 203. The first conductive structure 202 may include, for example, a stack of the first conductive pattern 203 and an insulation pattern 204. The first conductive pattern 203 may include, for example, a silicon-containing layer or a metal-containing layer. The first conductive pattern 203 may include, for example, a stack a silicon-containing layer and a metal-containing layer. The first conductive pattern 203 may include, for example, polysilicon, a metal, a metal nitride, a metal silicide, or the like. The first conductive pattern 203 may include, for example, a stack of a polysilicon layer and a metal layer. The first conductive pattern 203 may include, for example, tungsten. The insulation pattern 204 may include, for example, an oxide, a nitride, or the like. The insulation pattern 204 may include, for example, a hard mask pattern. The first conductive structure 202 and the second conductive structure 205 are formed to be a line type or a pillar type. Further, one of the first conductive structure 202 or the second conductive structure 205 may have line shape extending in one direction. The other of the first conductive structure 202 or the second conductive structure 205 may have a pillar shape. First conductive structures 202 may be regularly arranged on the substrate 201 at regular intervals. A width of the insulation pattern 204 may be made smaller than a width of the first conductive pattern 203 by a trimming process. A width of a lower portion of the insulation pattern 204, which contacts the first conductive pattern 203, is substantially identical to a width of the first conductive pattern 203. One of the first conductive structure 202 and the second conductive structure 205 may include, for example, a gate structure or a bit line structure, and the other of the first conductive structure 202 or the second conductive structure 205 may include, for example, a contact plug. The contact plug may include, for example, a storage node contact plug, a landing plug, a metal contact plug, or the like.

The second conductive structure 205 may include, for example, the second conductive pattern 206 formed between adjacent first conductive structures 202. The second conductive structure 205 may include, for example, a stack of a second conductive pattern 206 and a third conductive pattern 208. The second conductive pattern 206 may include, for example, a silicon-containing layer. The second conductive pattern 206 may include, for example, a polysilicon layer. The second conductive pattern 206 has a height substantially the same as or greater than that of the first conductive pattern 203. An open portion (not shown) is defined between adjacent first conductive structures 202, and the second conductive structure 205 is formed in the open portion. The open portion may expose the first conductive structure 202.

The third conductive pattern 208 may include, for example, a metal-containing layer. The third conductive pattern 208 may include, for example, a metal, a metal silicide, a metal nitride, or the like. The third conductive pattern 208 may include, for example, a stack of a barrier layer and metal layer. The third conductive pattern 208 may include, for example, a material comprising titanium or tungsten.

A fourth conductive pattern 207 is formed between the second conductive pattern 206 and the third conductive pattern 208. The fourth conductive pattern 207 may form an ohmic contact between the second conductive pattern 206 and the third conductive pattern 208. If the fourth conductive pattern 207 acts as the barrier layer, then an additional barrier layer would not be necessary.

The first spacer 210 is formed over the first conductive structure 202. An upper portion of the first spacer 210 is extended to a lower portion of the insulation pattern 204. A second spacer 211 is formed over an upper portion of the insulation pattern 204. A thickness of the second spacer 211 is greater than a thickness of the first spacer 210. The thickness of the second spacer 211 is sufficient to cap the air gap 209 and the first spacer 210. The first spacer 210 and the second spacer 211 include a material having a low dielectric constant. The low dielectric constant material may include, for example, an oxide or a nitride. The first spacer 210 and the second spacer 211 may include, for example, a silicon oxide, a silicon nitride, or a metal oxide. The first spacer 210 may include, for example, a material having a high density. The second spacer 211 may include, for example, a material having a low density. The first spacer 210 may include, for example, a silicon nitride. The second spacer 211 may include, for example, a silicon oxide. The silicon oxide may include, for example, $SiO_2$. The silicon nitride may include, for example, $SI_3N_4$ or SiN. The second spacer 211 may include, for example, a silicon oxide having a low density. The first spacer 210 acts as a passivation layer and the second spacer 211 acts as a capping spacer.

The air gap 209 is formed by removing a sacrificial material that is formed between first spacer 210 and the second conductive pattern 206 through a conversion process (as described above). After forming the second conductive pattern 206, the first spacer 210 and the second spacer 211 are formed by removing the sacrificial material.

In FIG. 4, the air gap 209 is stably capped by the second spacer 211. Due to the air gap 209, a parasitic capacitance between the first and second conductive patterns 202 and 206 may be reduced.

Since the second spacer 211 is formed over the trimmed insulation pattern 204, a thickness of the second spacer 211 is sufficient to cap the air gap 209, so that the air gap 209 is stably protected by the second spacer 110. Even though, the thickness of the second spacer 211 is thicker than prior to, a space sufficient to form the third conductive patterns 202 is secured. In addition, by enlarging an area to form the fourth conductive patterns 207, a contact resistance between the second conductive pattern 206 and the third conductive pattern 208 may be improved.

FIGS. 5A to 5I are cross sectional views illustrating an exemplary method for fabricating the semiconductor device of FIG. 4.

Figure 5A:
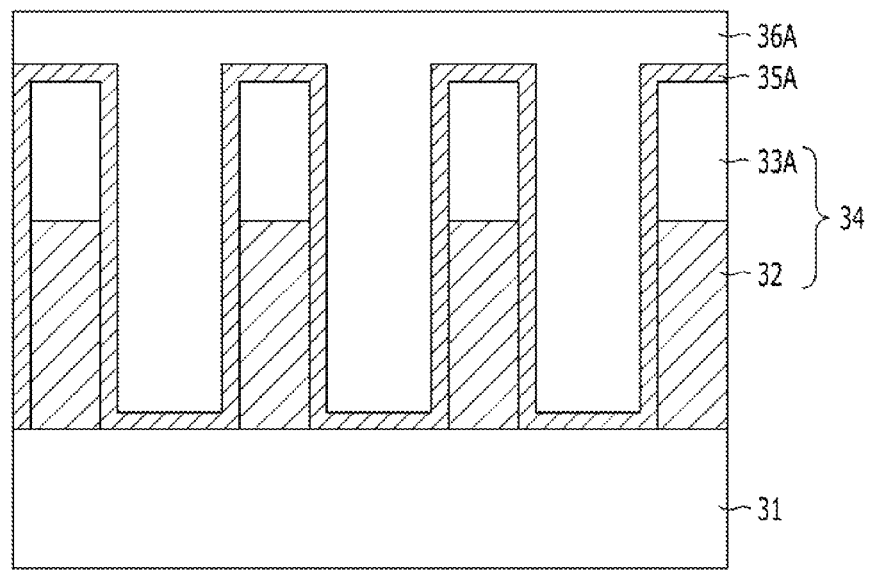
FIGS. 5A to 5I are cross sectional views illustrating an method of fabricating the exemplary semiconductor device of FIG. 4.

Referring to FIG. 5A, a plurality of first conductive structures 34 are formed over a substrate 31. The substrate 31 may include, for example, a semiconductor substrate. The substrate 31 may include, for example, a silicon substrate, a silicon germanium substrate, or the like. Furthermore, the substrate 31 may include, for example, a silicon-on-insulator (SOI) substrate.

The first conductive structures 34 are regularly arranged at a certain interval. To form the first conductive structures 34, a hard mask pattern 33A is formed over a first conductive layer (not shown), and the first conductive layer is etched using the hard mask pattern 33A as an etch barrier to form a first conductive pattern 32. As a result, the first conductive structures 34 have a stack of the first conductive pattern 32 and the hard mask pattern 33A. The first conductive pattern 32 may include, for example, a silicon-containing layer or a metal-containing layer. For example, the first conductive pattern 32 may include, for example, polysilicon or tungsten. The first conductive pattern 32 may include, for example, a stack of a silicon-containing layer and a metal-containing layer. For example, the first conductive pattern 32 may include, for example, a stack of a polysilicon layer and a tungsten layer. At this time, a barrier layer is formed between the polysilicon layer and the tungsten layer. The first conductive pattern 32 may include, for example, a stack conductive structure of a polysilicon layer, a titanium-containing layer, and a tungsten layer. The titanium-containing layer is used as a barrier layer, and may include, for example, a stack of a titanium layer and a titanium nitride layer. The hard mask pattern 33A may include, for example, an insulating material.

A first insulation layer 35A is formed over the first conductive structures 34. The first insulation layer 35A may include, for example, a low-k material. The first insulation layer 35A may include, for example, an oxide, a nitride, or the like. For example, the first insulating layer 35A may include a silicon nitride, a silicon oxide, or the like. The first insulation layer 35A may be conformally formed over the entire surface of the resulting structure comprising the first conductive structures 34. The first insulation layer 35A will become a spacer in a subsequent process.

A second insulation layer 36A is formed over the first insulation layer 35A. The second insulation layer 36A may include, for example, a silicon oxide. The second insulation layer 36A is formed over the first insulation layer 35A to fill spaces between the first conductive structures 34. The second insulation layer 36A may include, for example, a material that can serve as an inter-layer insulation layer.

Figure 5B:
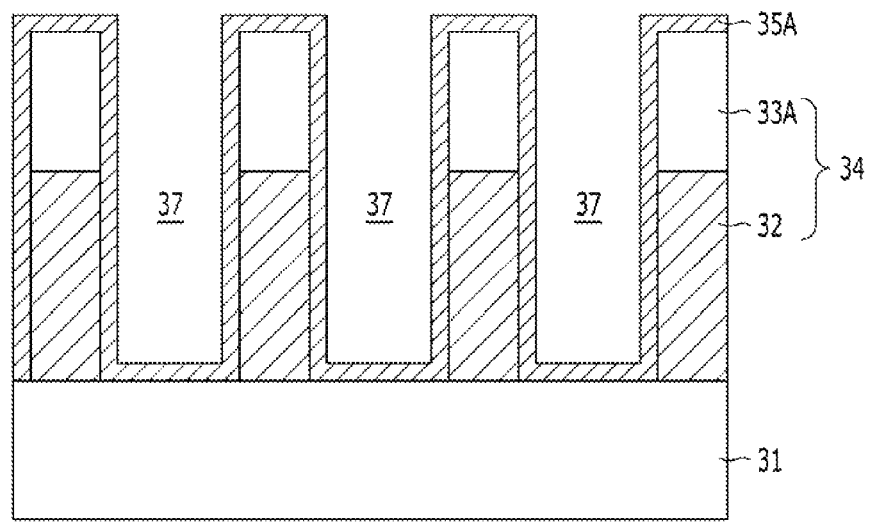

Referring to FIG. 5B, a planarization process is performed on the second insulation layer 36A to expose a surface of the first insulation layer 35A.

The second insulation layer 36A is etched to form an open portion 37. After forming the open portion 37, the second insulation layer 36A is removed. A mask pattern (not shown) may be used to form the open portion 37. The open portion 37 is formed in a hole shape or a line shape. The open portion 13 is formed between the first conductive structures 34. The first insulation layer 35A is exposed at sidewalls defining the open portion 37.

The first insulation layer 35A may remain on the substrate 31 below the open portion 37.

Figure 5C:
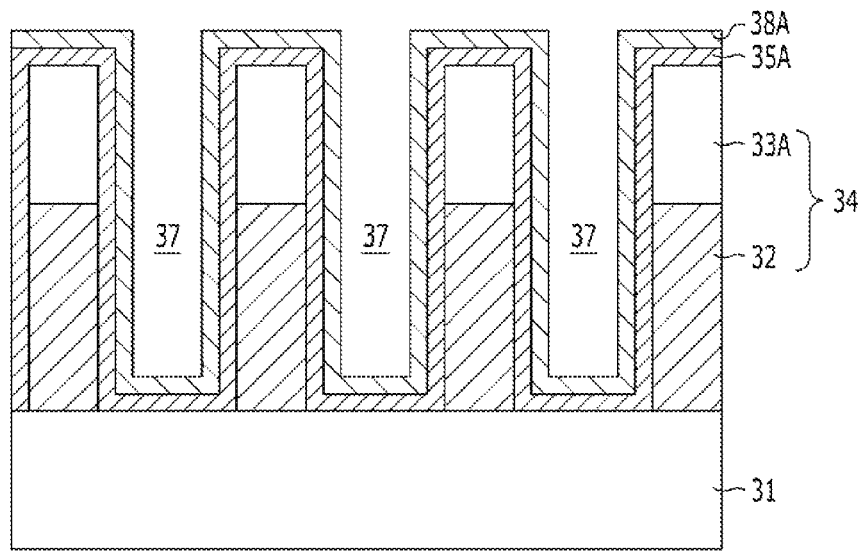

Referring to FIG. 5C, a sacrificial layer 38A is formed over the entire surface of the resulting structure, including the open portion 37. The sacrificial layer 38A may be conformally formed over the first insulation layer 35A. The sacrificial layer 38A may be etched during a subsequent process to form an air gap. The sacrificial layer 38A may include, for example, a material having a low dielectric constant. The sacrificial layer 38A may include, for example, a material for forming volatile products by a conversion process (as described above). The sacrificial layer 38A is formed at a temperature above at least 400° C. The dielectric constant of the sacrificial layer 38A has value between a dielectric constant of air and a dielectric constant of $SiO_2$. The sacrificial layer 38A may include, for example, a carbon-containing material. The sacrificial layer 38A may include, for example, an amorphous carbon.

In an alternative implementation, after forming the open portion 37, the first insulation layer 35A and the sacrificial layer 38A may be sequentially formed. Accordingly, the first insulation layer 35A and the sacrificial layer 38A may be formed to cover an exposed surface of the substrate 31, the sidewalls that define the open portion 37, and a top surface of the hard mask pattern 33A.

Figure 5D:
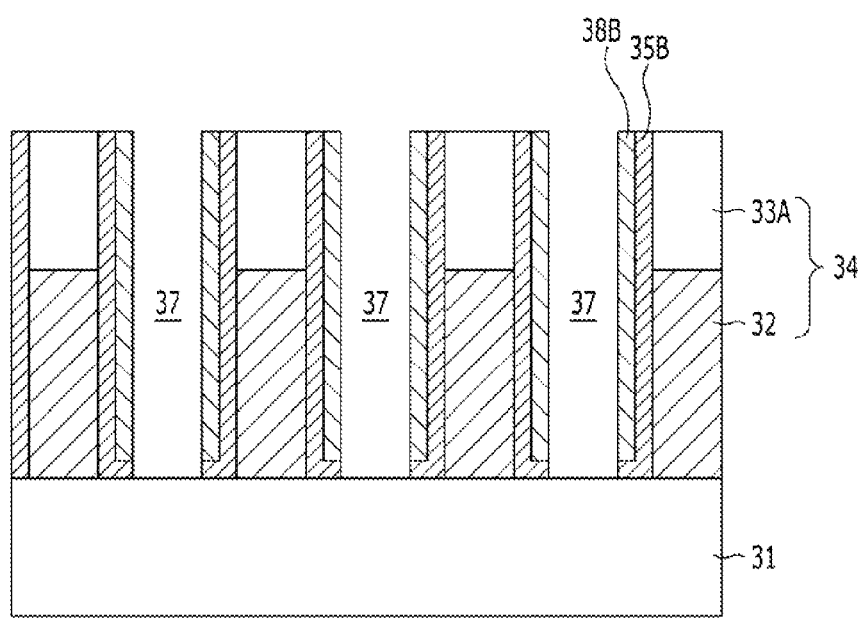

Referring to FIG. 5D, a sacrificial pattern 38B is formed by selectively etching the sacrificial layer 38A. A dry etching process may be used to form the sacrificial pattern 38B. The dry etching process may include, for example, an etch-back process. Thus, the sacrificial pattern 38B is formed adjacent to the first conductive structures 34.

At this time, the first insulation layer 35A formed over the exposed surface of the substrate 31 and the top surface of the hard mask pattern 33A is selectively etched. A first spacer 356 may be formed by selectively etching the first insulation layer 35A. The first spacer 356 may be formed over the first conductive structures 34. The sacrificial pattern 385 remains on the first insulation pattern 356. A dry etching process may be used to form the first insulation pattern 35B. The dry etching process may include, for example, an etch-back process. By forming the first insulation pattern 35B, a surface of the substrate is exposed. The sacrificial pattern 38B is separated from the substrate 31 by a lower portion of the first insulation pattern 35S.

As describe above, a dual spacer structure of the first spacer 35G and the sacrificial pattern 38B is formed over the first conductive structures 34. The dual spacer structure is formed over the sidewalls defining the open portion 37. The open portion 37 may form to have a line type or a hole type.

Figure 5E:
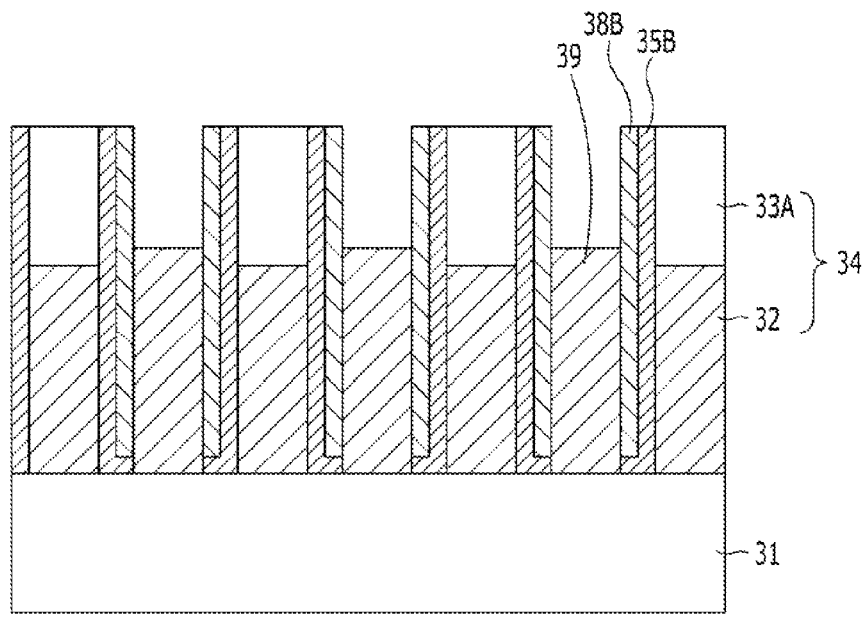

Referring to FIG. 5E, a second conductive pattern 39 is formed to fill a part of the open portion 37. In other words, the second conductive pattern 39 is formed to be recessed in the open portion 37. The second conductive pattern 39 may be formed by performing a planarization process and a recessing process on a second conductive layer (not shown). The second conductive layer may be formed at a temperature below about 400° C. An etch-back process or a chemical mechanical polishing (CMP) process may be performed on the second conductive pattern 39. The second conductive pattern 39 has a recessed surface lower than top surfaces of the first conductive structures 34. The recessed surface of the second conductive pattern 39 is adjusted to have a height higher than a top surface of the first conductive pattern 32. The height of the recessed surface of the second conductive pattern 39 may be adjusted to minimize a facing area to the first conductive pattern 32. Accordingly, parasitic capacitance between the first conductive pattern 32 and the second conductive pattern 39 may be reduced. The second conductive pattern 39 may include, for example, a silicon-containing layer. The second conductive pattern 39 may include, for example, polysilicon layer.

A part of the sacrificial pattern 38S is exposed after the second conductive pattern 39 is recessed.

Figure 5F:
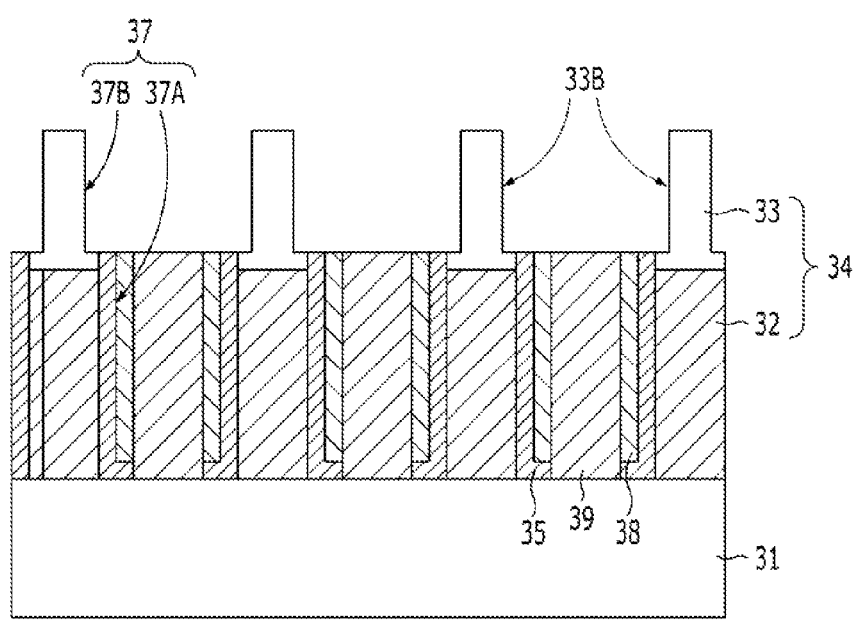

Referring to FIG. 5F, the sacrificial pattern 38B may be recessed to form a sacrificial spacer 38. The sacrificial pattern 38S may be selectively etched to form the sacrificial spacer 38. The part of the sacrificial pattern 38S that is exposed after the second conductive pattern 39 is recessed to a certain depth. An etch-back process may be applied to recess the sacrificial pattern 38B.

A first spacer 35 may be formed by selectively etching the first insulation pattern 35S. The sacrificial spacer 38 is formed by selectively etching the sacrificial pattern 38B.

An isotropic etching process may be used for recessing the first spacer 35B and the sacrificial pattern 38S. The first spacer 35 and the sacrificial spacer 38 are formed between the second conductive pattern 39 and the first conductive structures 34. In another exemplary implementation the second conductive pattern 39, the sacrificial spacer 38 and the first spacer 35 may be simultaneously recessed.

Accordingly, the hard mask pattern 33A of first conductive structures 34 are exposed by the forming process of the sacrificial spacer 38 and the first spacer 35.

Then, a trimming process is performed on the exposed hard mask pattern 33A to form a trimmed hard mask pattern 33. The trimming process may be performed by an isotropic etching process. The isotropic etching process for forming the first spacer 35 and the trimming process for the hard mask pattern 33A may be the same process. That is, the isotropic etching process for forming the first spacer 35 may performed by performing the trimming process for the hard mask pattern 33A. In an exemplary implementation, an isotropic etching process for forming a sacrificial spacer 38 and an isotropic etching processes for forming the first spacer 35B and the hard mask pattern 33A may be simultaneously performed.

A width of sidewalls (33B) of the hard mask pattern 33A is decreased by the trimming process and a width of a top portion of the open portion 37 is increased by the trimming of the hard mask pattern 33A. A thickness of a subsequent second spacer 40 will be increased by increasing the width of the top portion of the open portion 37. The sacrificial spacer 38 will be entirely capped by the thick second spacer 40.

As describe above, the second open region 37B is formed by the trimming process. The first open region 37A may contain, for example, the first spacer 35 and the sacrificial spacer 38. The open region 37 may include, for example, the first open region 37A and the second open region 37B. The width of the second open region 37B may be greater than the width of the first open region 37A.

Figure 5G:
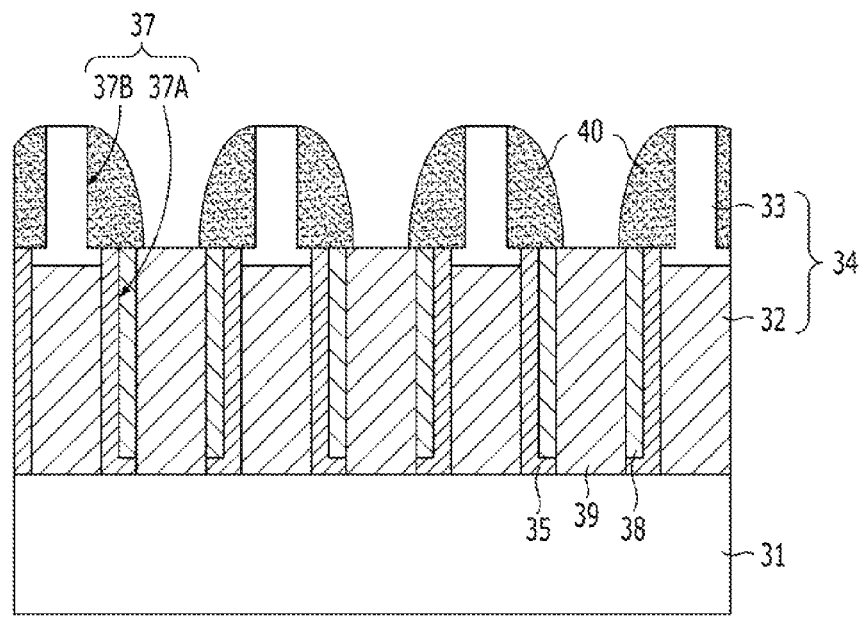

Referring to FIG. 5G, the second spacer 40 is formed. A third insulation layer (not shown) is formed over the entire surface of the resulting structure, including the trimmed hard mask pattern 33. The third insulation layer may be conformally formed over the entire surface of the resulting structure, including the trimmed hard mask pattern. An isotropic etching process may be used to form the second spacer 40. The isotropic etching process may include, for example, an etch-back process. Accordingly, the second spacer 40 is formed over the trimmed hard mask pattern 33. That is, the second spacer 40 is formed over the trimmed hard mask pattern 33 that define the second open region 37B. The second spacer 40 may be formed by etching the third insulation layer. The second spacer 40 may include, for example, a material having a low dielectric constant. The second spacer 40 may include, for example, a material having a low dielectric constant and a low density. The second spacer 40 may include, for example, a porous dielectric material. The second spacer 40 may include, for example, a silicon oxide, a silicon oxide having a low density, or the like. Volatile byproducts are diffused through the low density silicon oxide. The silicon oxide having a low density is formed by a low temperature CVD. For example, the silicon oxide having a low density may include, for example, $SiO_2$ formed by low temperature CVD. Since the second spacer 40 is formed at a low temperature below at least 400° C., the second spacer 40 has a low density. The second spacer 40 may include a material having a low density and being capable of diffusing by oxygen plasma in a plasma stripper.

The second spacer 40 has a sufficient thickness to cap an upper portion of the sacrificial spacer 38. The second spacer 40 is formed to expose the upper portion of the first conductive pattern 32. That is, the second spacer 40 covers the first spacer 35 and the sacrificial spacer 38. The upper surface of the second conductive pattern 3 is exposed.

Since the hard mask pattern 33A is trimmed, the second spacer 40 is formed to have an increased thickness. Also, an exposed area of the second conductive pattern 39 is wide, even though the thickness of the second spacer 40 is increased. The second spacer 40 is formed to cap the upper portions of the sacrificial spacer 38 and the first spacer 35, and to expose the upper portion of the first conductive pattern 32. That is, a thickness of the third insulation layer is determined to cap the upper portions of the sacrificial spacer 15. The width of the second open portion 13C is great, the thickness of the second spacer 17 is thick, so that the sacrificial spacer 15 is entirely capped and the upper portion of the first conductive pattern 16 is widely exposed.

As describe above, each of the insulation structures formed sidewalls of the first conductive structures 34 is different from the insulation structures formed sidewalls of the trimmed hard mask pattern 33 That is, a dual spacer structure including the first spacer 35 and the sacrificial spacer 38 is formed over the first conductive pattern 32 and lower sidewalk of the first conductive structures 34. A single spacer structure comprising the second spacer 40 is formed over the trimmed hard mask pattern 33, and upper sidewalls of the first conductive structures 34.

Figure 5H:
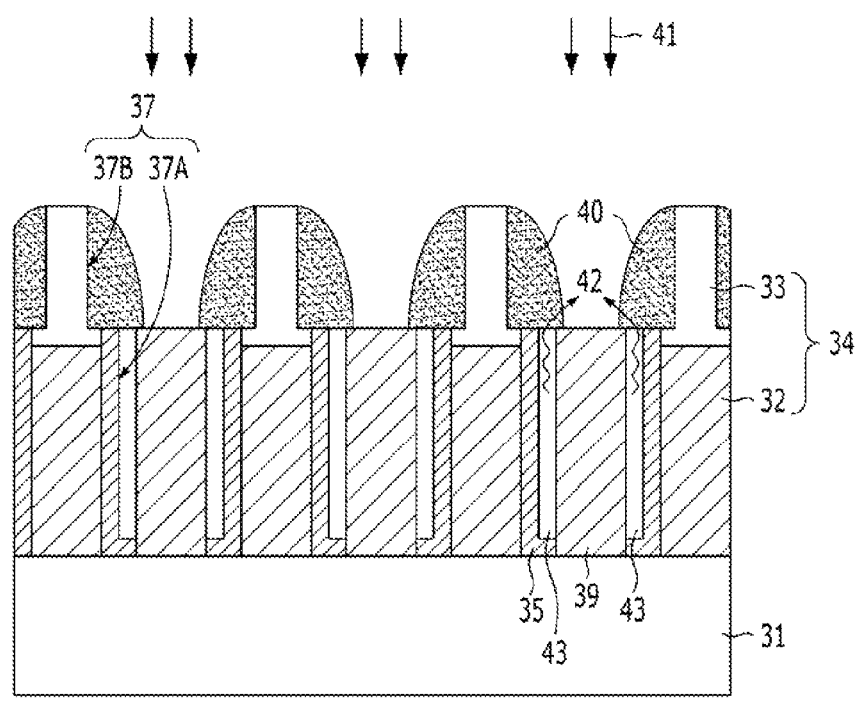

Referring to FIG. 5H, a conversion process 41 is performed to remove the sacrificial spacer 38. A material of the sacrificial spacer 38 is converted to volatile byproducts 42 by the conversion process 41. The conversion process 41 may include, for example, a decomposition process, a phase change process, or the like. The decomposition process and the phase change process turn a solid into a vapor or a gas. The volatile byproducts 42 include vapor, gas, or the like. The volatile byproducts 42 are easily removed by diffusing through the second spacer 40. The sacrificial spacer 38 is removed without an etching process such as a wet etching process.

If the sacrificial spacer 38 is, for example, an amorphous carbon, then the conversion process 41 may include, for example, an oxidation reaction process, such as an $O_2$ plasma treatment process. The $O_2$ plasma treatment process may be performed using a plasma stripper. The amorphous carbon is oxidized to form a vapor or a gas by the $O_2$ plasma treatment process. For example, when the $O_2$ plasma permeates the amorphous carbon through the second spacer 40, the amorphous carbon is turned into volatile byproduct 42, such as carbon oxide CO2. The volatile byproducts 42 are diffuse through the second spacer 40. The low density material of the second spacer 40 allows the $O_2$ plasma to permeate the second spacer 42 and allows the volatile byproducts 42 to diffuse out through the second spacer 42.

In contrast, the first spacer 35 blocks the diffusion of the volatile byproducts 42, since the first spacer 35 may include, for example, a high density material. That is, the first spacer 35 acts as a passivation spacer for blocking the diffusion of the volatile byproducts 42.

When the sacrificial spacer 38 is removed by the conversion process 41, a space previously occupied by the sacrificial spacer 38 becomes an air gap 43. Since the air gap 43 is capped by the second spacer 40, the air gap 43 is stably capped even though the sacrificial spacer 38 is removed. A parasitic capacitance between adjacent second conductive patterns 39 may be reduced by the air gap 43. Thus the air gap 43 and the first spacer 35 are formed between the first conductive pattern 32 and the second conductive pattern 39 and the air gap is formed between the first spacer 35 and the second conductive pattern 39. If the second conductive pattern 39 is a contact plug, then the air gap 43 may be formed to surround the second conductive pattern 39.

Figure 5I:
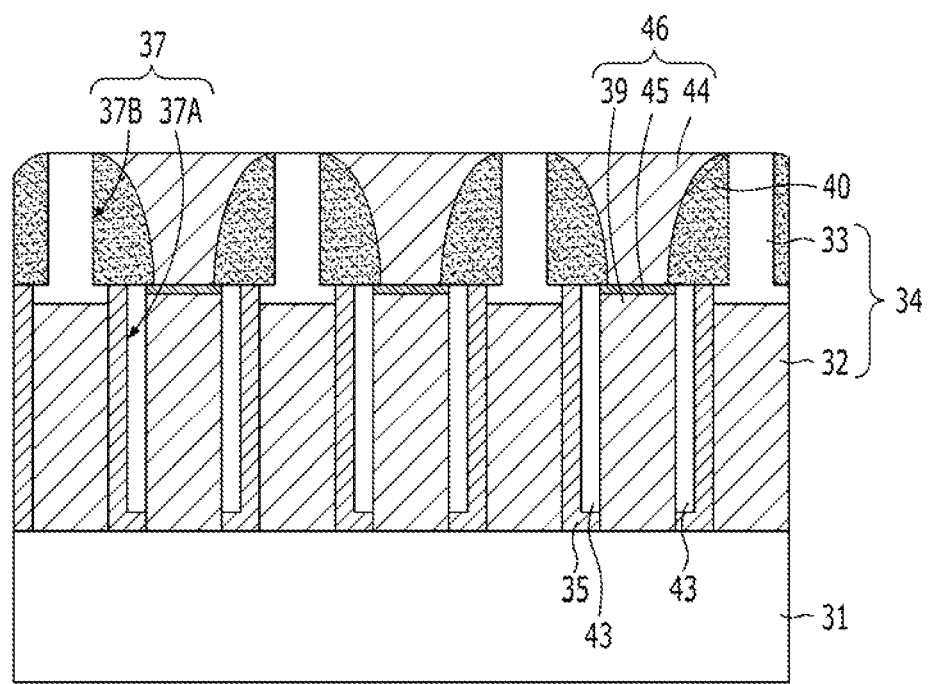

Referring to FIG. 5I, a third conductive pattern 44 is formed over a second conductive pattern 39. The third conductive pattern 44 fills the second open portion 37B having the second spacer 40. The third conductive pattern 44 may include, for example, a metal-containing layer. The third conductive pattern 44 may include, for example, a tungsten layer. The third conductive pattern 44 may include, for example, a stack of a barrier layer and a tungsten layer. The barrier layer may include, for example, a stack of a titanium layer and a titanium nitride layer.

A fourth conductive pattern 45 is formed between the second conductive pattern 39 and the third conductive pattern 44. The fourth conductive pattern 45 may form an ohmic contact between the second conductive pattern 39 and the third conductive pattern 44. The fourth conductive pattern 45 may include, for example, a metal silicide. The fourth conductive pattern 45 may include, for example, a cobalt silicide. To form the cobalt silicide, an annealing process is performed after a cobalt layer is deposited over the second conductive pattern 39. Alternatively, the cobalt silicide may be directly deposited over the second conductive pattern 39. The deposited cobalt silicide may be simultaneously formed between the second conductive pattern 39 and the third conductive pattern 44 and between the third conductive pattern 44 and the second spacer 40.

When the third conductive pattern 44 is formed, a second conductive structure 46, including the second conductive pattern 39, the fourth conductive pattern 45 and the third conductive pattern 44, is formed. The air gap 43 is formed between the second conductive pattern 39 and sidewalls that define the first open region 37A. The second spacer second spacer 40 is formed between the third conductive pattern 44 and sidewalls that define the second open region 37B. The second spacer 40 caps the air gap 43 and the first spacer 35.

The second conductive structure 46 may become a contact plug, an electrode, or the like. Further, the second conductive structure 46 may become a bit line, a metal interconnection, a gate electrode, a word line, or the like. For, example, if the first conductive structure 34 is a bit line, the second conductive structure 46 may be a storage contact plug.

In accordance with the exemplary implementations described above, by forming the air gap 43, a parasitic capacitance between the first conductive structures 34 and the 36 may reduced.

Since the second spacer 40 is formed over the sidewalls that define the second open portion 37B, a thickness of the second spacer 40 is thick enough to cap the air gap 43, so that the air gap 43 is stably protected by the second spacer 40. Even though, the thickness of the second spacer 40 is thicker than prior to, a space sufficient to form the third conductive pattern 44 is secured. In addition, by enlarging an area to form the fourth conductive pattern 45, a contact resistance may be improved.

The 212 may include, for example, a material having a low dielectric constant. The third spacer 212 may include, for example, a material having a low dielectric constant of lower dielectric constant than the first spacer 210 and the second spacer 211. Dielectric constant of the third spacer 212 has a value between an airs to $SiO_2$. For example, the third spacer 212 may include, for example, a carbon-containing material. The third spacer 212 may include, for example, an amorphous carbon. Dielectric constant of the amorphous carbon is lower than a silicon oxide. Dielectric constant of $SiO_2$ is 3.9 and dielectric constant of the amorphous carbon is equal to or less than 3. The dielectric constant of the amorphous carbon s controlled by a method for forming or impurity content. For example, the dielectric constant of the amorphous carbon containing hydrogen is equal or less than 2.1.

The third spacer 212 corresponds to the sacrificial spacer 38 formed through the method for fabricating the semiconductor device show in FIGS. 5A to 5G. However, in this case, a conversion process is not performed after the second spacer is formed. Since the conversion process is not performed, the sacrificial spacer 38 may remain. Thus, the remaining sacrificial spacer 38 is the third spacer 212.

Figure 6:
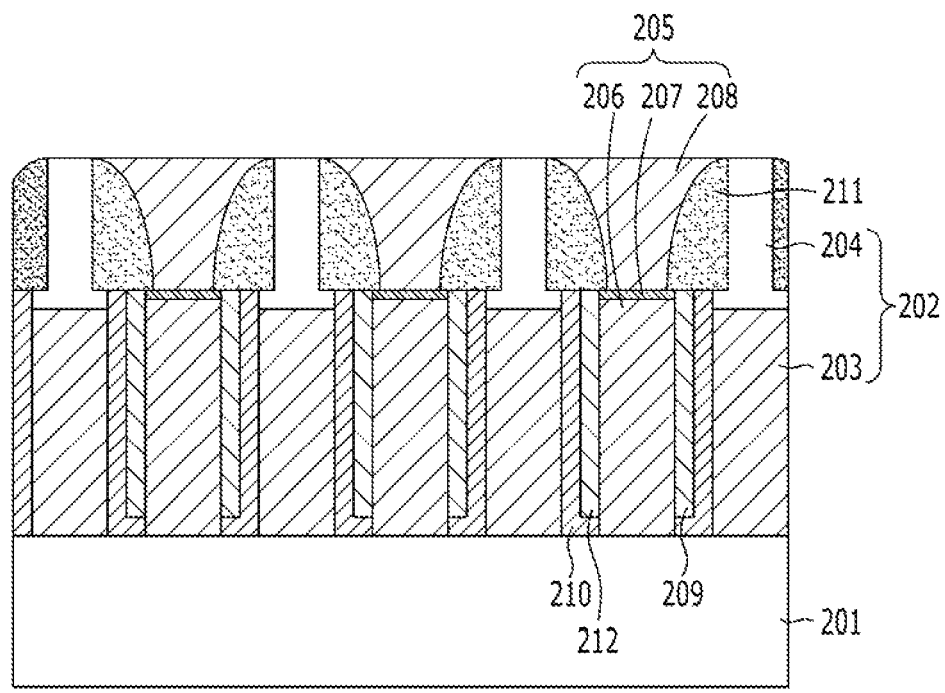
FIG. 6 is a modification of the exemplary semiconductor device shown in FIG. 4.

In FIG. 6, since the third spacer 212 is formed of a carbon-containing material having the low dielectric constant, a parasitic capacitance between two conductive patterns is reduced between disposed adjacent to the second conductive pattern 206. The third spacer 212 is stably protected by the second spacer 211. Since the second spacer 211 is formed over the trimmed hard mask pattern 204, a thickness of the second spacer 211 is thick enough to cap the third spacer 212, so that the third spacer 212 is stably capped by the second spacer 211. Even though, the thickness of the second spacer 211 is thicker than prior to, a space sufficient to form the third conductive patterns 208 is secured. In addition, by enlarging an area to form the fourth conductive patterns 207, a contact resistance between the second conductive pattern 206 and the third conductive patterns 208 may be improved.

FIGS. 7A to 7D illustrate a comparative example.

Figure 7A:
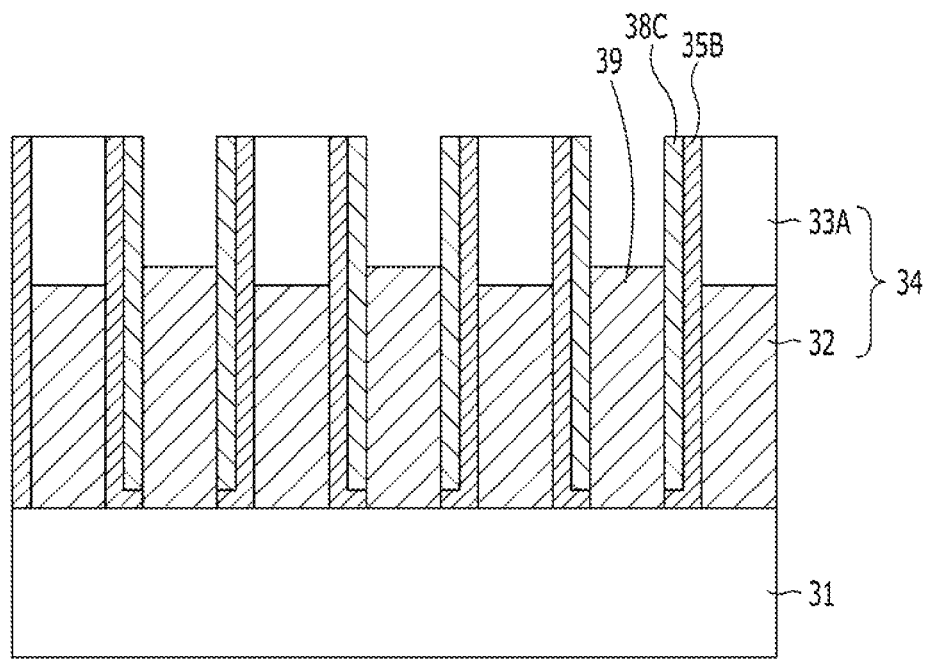
FIGS. 7A to 7D illustrate a comparative example with FIG. 4.
Figure 7B:
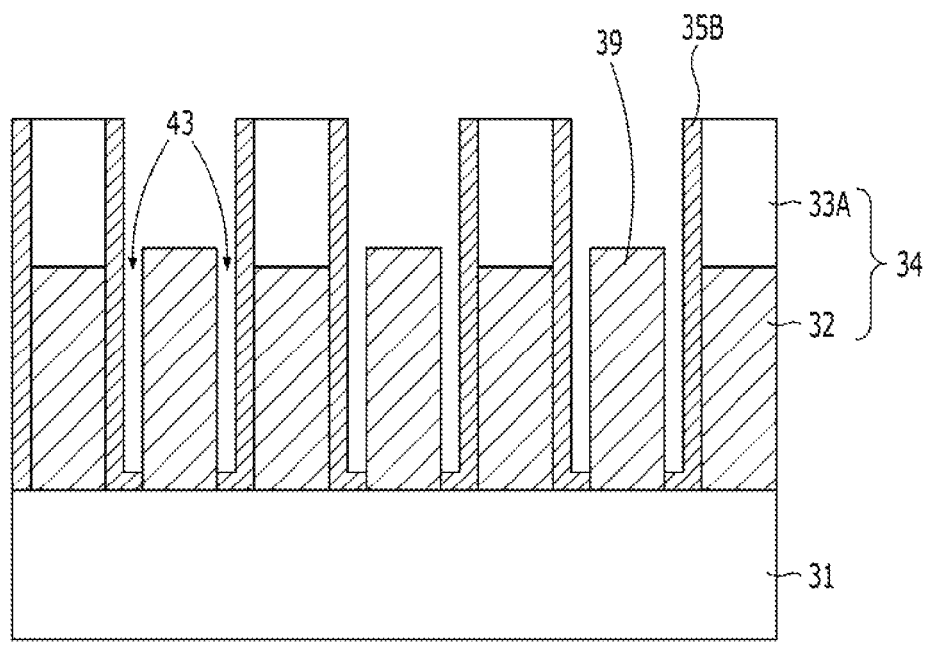

Referring to FIG. 7A, a plurality of first conductive structures 34 are formed over a substrate. Each of the first conductive structures 34 may include, for example, a first conductive pattern 32 and a hard mask pattern 33A.

After forming an open portion (not shown) between the first conductive structures 34, a first spacer 35B and a sacrificial spacer 38C are formed over the first conductive structures 34.

Subsequently, a recessed second conductive pattern 39 is formed.

Referring to FIG. 73, an air gap 43 is formed by removing the recessed sacrificial spacer 38C.

Figure 7C:
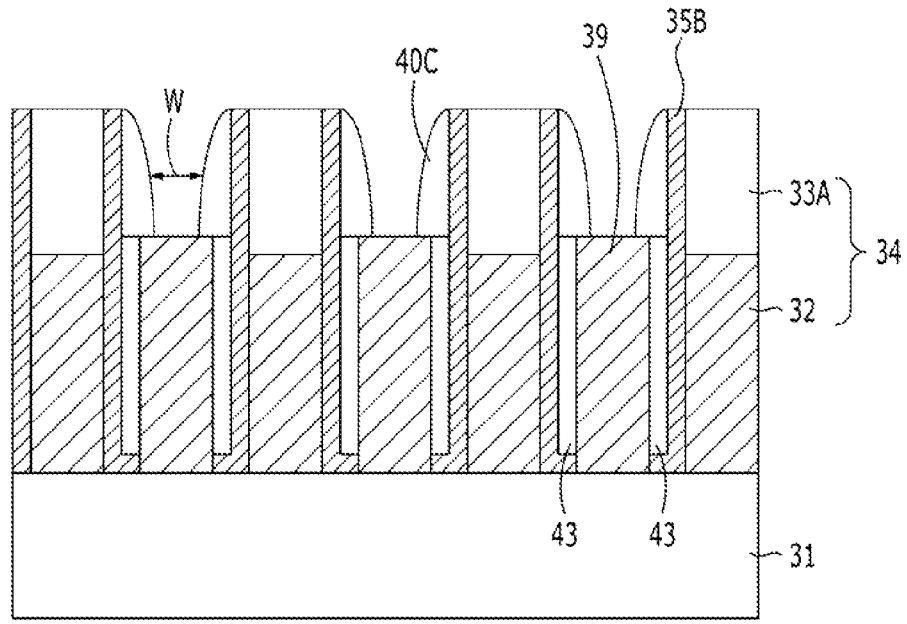

Referring to FIG. 7C, a capping spacer 40C is formed to cap the air gap 45. Also, a second conductive structure 46 is formed by forming a fourth conductive pattern 45 and a third conductive pattern 44 over the second conductive pattern 39 in a subsequent process.

In the comparative example, the sacrificial spacer 38C may be formed of silicon oxide, silicon nitride, titanium nitride, or the like. To form the air gap 43, a wet etching process may be used to remove the sacrificial spacer 38C. Also, since the hard mask pattern 33A may not be trimmed, a thickness of the capping spacer 40C may be increased to stably cap the air gap 43. Accordingly, an exposed area of the second conductive pattern 39 is reduced.

However, in the comparative example, a loss of surrounding structures and a surface of the substrate 31 are incurred since the sacrificial spacer 38C is removed by the wet etching process.

Figure 7D:
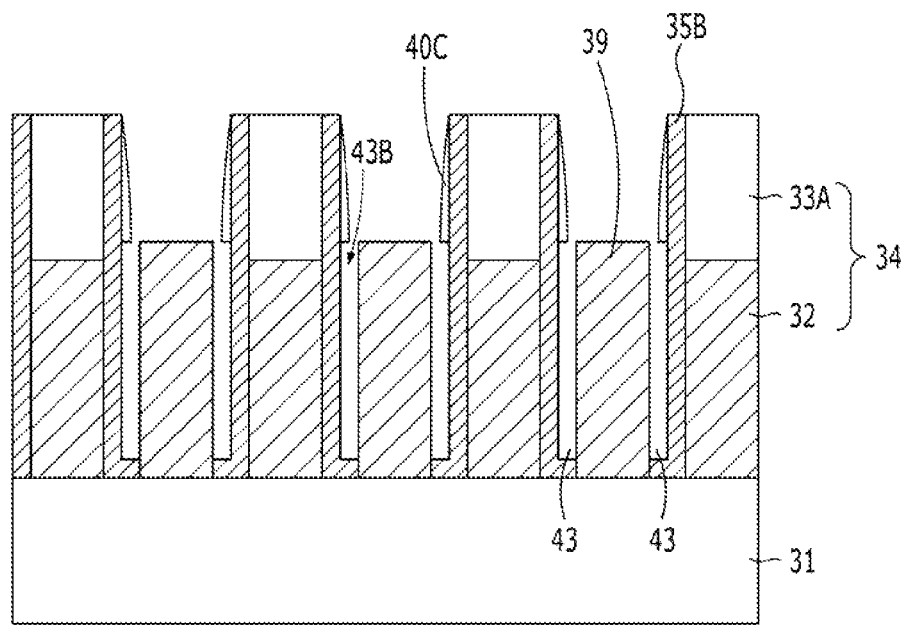

In particular, if the thickness of the second spacer 40C decreases, then the air gap 43 is opened while the second spacer 40C is formed, as shown by reference numeral 43B in FIG. 7D. Due to the opened the air gap 43, the third conductive pattern 44 flows into the air gap 43, so it is difficult to decreasing the parasitic capacitance by the air gap 43. Furthermore, if a thickness of the second spacer 40C increases, a space W to form the third conductive pattern 44 and a space to form the fourth conductive pattern 45 are decreased, thereby increasing a contact resistance between the third conductive patterns 44 and the fourth conductive patterns 45 may be increased The etching process to removing the titanium nitride used as the sacrificial spacer 38C has a high level of difficulty. Therefore, it is difficult to remove the titanium nitride using the wet etching process. Also, since an etch selectivity of the sacrificial spacer 38C is lower than the hard mask pattern 33A and the first spacer 35B, a loss of the hard mask pattern 33A and the first spacer 35B may be incurred.

Therefore, as can be seen by this comparative example, the air gap in an exemplary implementation may be formed without a loss of the surrounding structures using the conversion process. In contrast, the etching process of the comparative example results in a loss of surrounding structures. Also, in the exemplary implementations, the sacrificial material is essentially completely removed by the conversion process and the air gap is stably capped by forming the air gap after forming the second spacer.

Figure 8A:
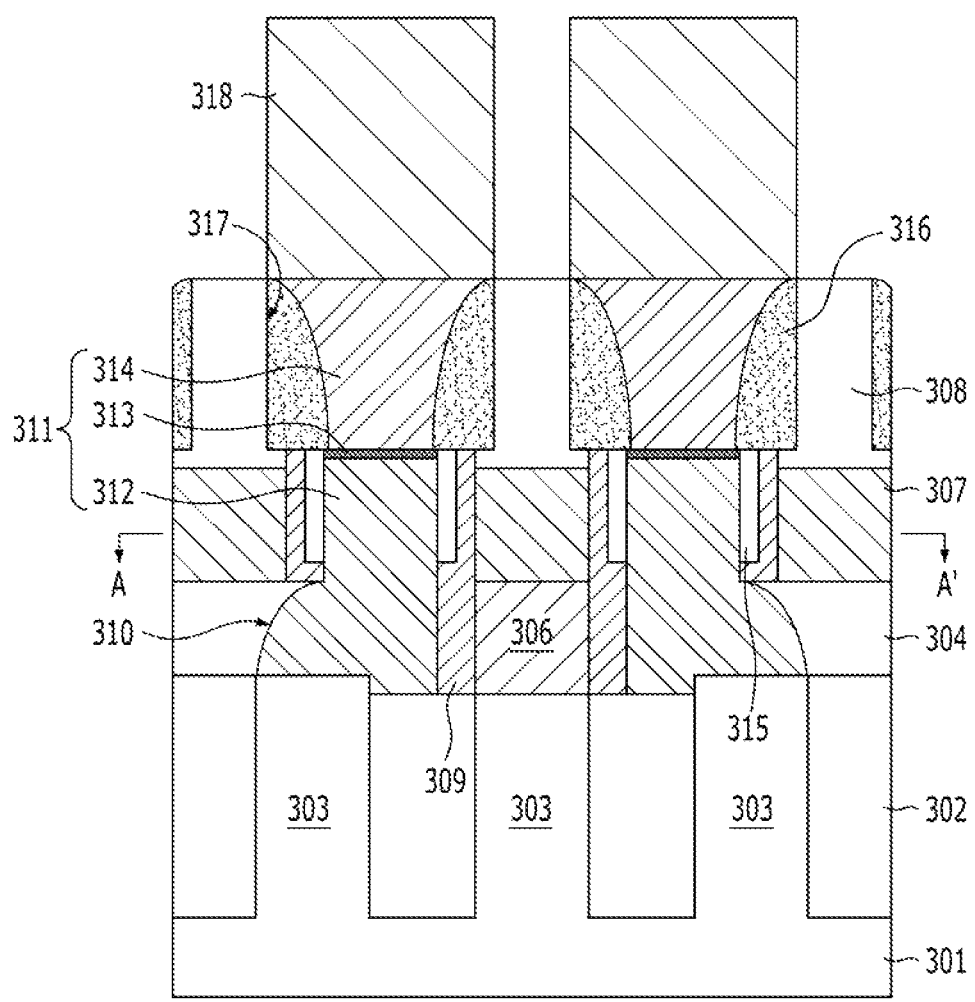
FIG. 8A illustrates exemplary memory cells of a semiconductor device.
Figure 8B:
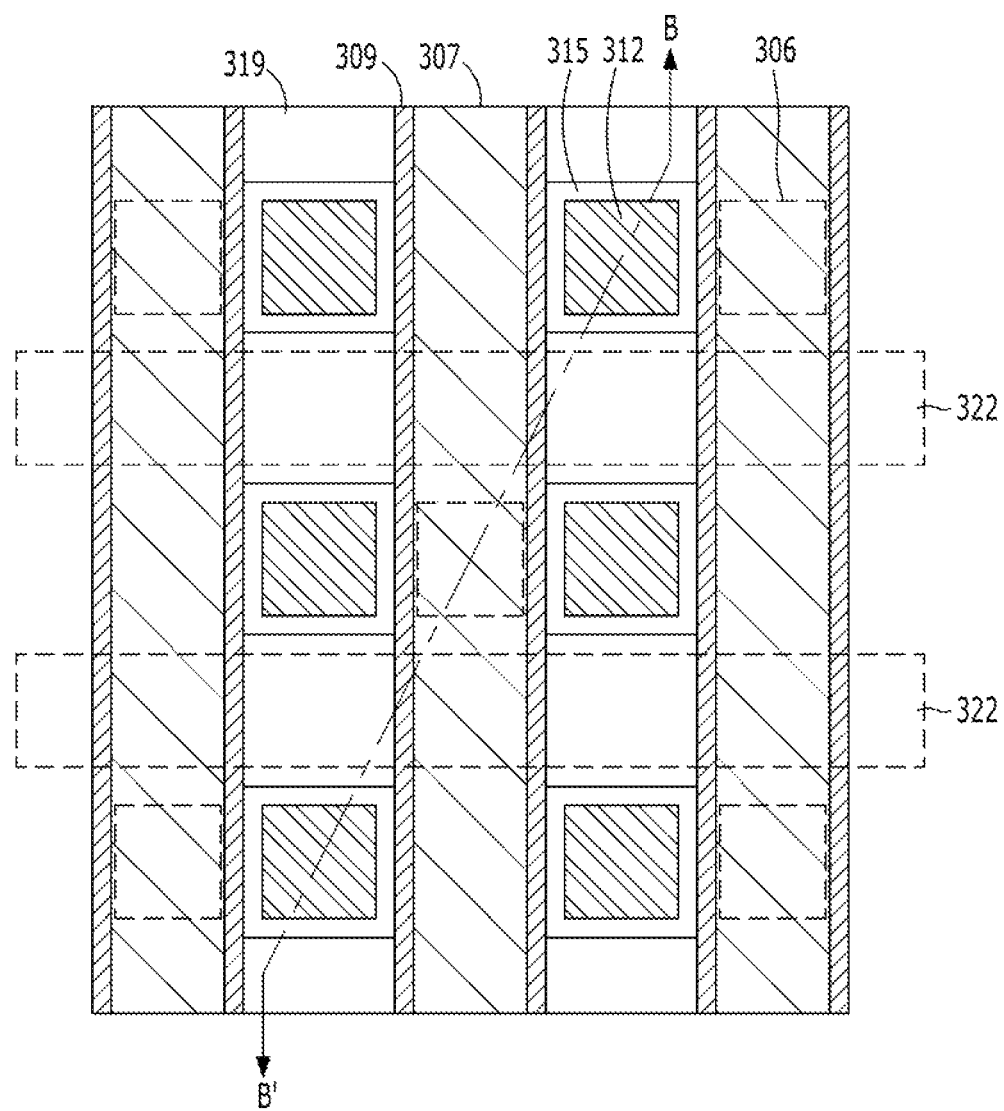
FIG. 8B is a cross-sectional view of the exemplary memory cells taken along line A-A' of FIG. 8A.

FIG. 8A illustrates exemplary memory cells of an exemplary semiconductor device. FIG. 8B is a cross-sectional view of the memory cells taken along line A-A' of FIG. 8A, FIG. 8C is a cross-sectional view of the memory cells taken along line B-B' of FIG. 8B.

For reference, the memory cells shown in FIG. 8A may include, for example, DRAM memory cells.

Figure 8C:
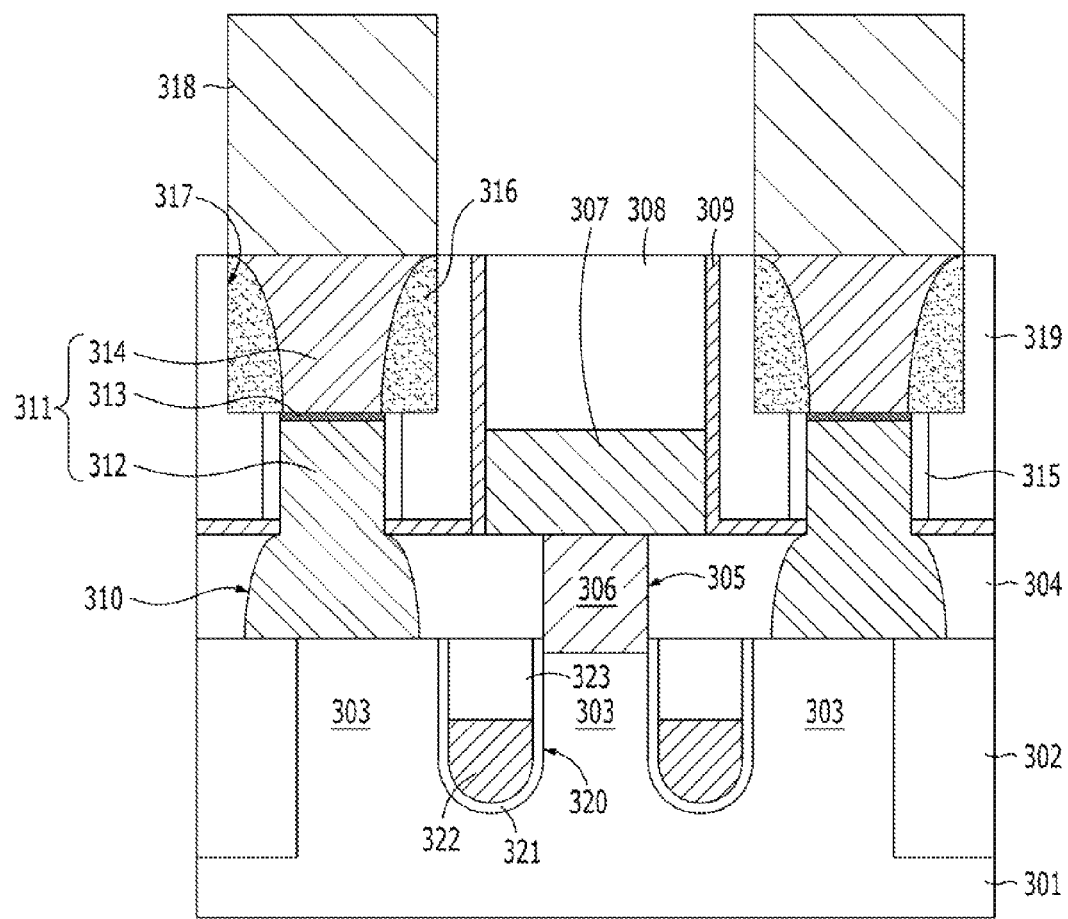
FIG. 8C is a cross-sectional view of the exemplary memory cells taken along line B-B' of FIG. 8B.

Referring to FIGS. 8A to 8C, an active region 303 is defined by a device isolation region 302 in a substrate 301. A trench 320 is formed across the active region 303. A gate dielectric layer 321 is formed along a surface of the trench 320. A buried gate electrode 322 is formed over the gate dielectric layer 321 to partially fill the trench 320. Although not illustrated, source/drain regions are formed in the substrate 301. A sealing layer 323 is formed over the buried gate electrode 322.

A bit line structure, comprising a bit line 307 extending in a direction crossing the buried gate electrode 322, is formed. The bit line structure may include, for example, the bit line 307, a bit line hard mask 308, and a bit line spacer 309. The bit line 307 is coupled to the active region 303 via a bit line contact plug 306. The bit line contact plug 306 is formed in a bit line contact hole 305 that is formed in a first inter-layer insulation layer 304. Sidewalls of the bit line hard mask 308 are trimmed, so that a width of the bit line hard mask 308 is smaller than a width of the bit line 307.

The storage node contact plug 311 is formed in the first and second storage node contact holes 310 and 317 that penetrate the first inter-layer insulation layer 304 and a second inter-layer insulation layer 319. The width of the second storage node contact hole 317 is increased by the trimming the side ails of the bit line hard mask 308. The first storage node contact hole 310 may be enlarged in a horizontal direction by an isotropic etching process. The storage node contact plug 311 may include, for example, a first plug 312, an ohmic contact layer 313, and a second plug 314. The first plug 312 may be a silicon plug including, for example, polysilicon. The second plug 314 may be a metal plug, including, for example, tungsten. The ohmic contact layer 313 may include, for example, a metal silicide. The ohmic contact layer 313 may include, for example, a cobalt silicide.

An insulating structure comprising an air gap 315 is formed between the storage node contact plug 311 and the bit lime 307. That is, the first plug 312 is formed away from the bit line 307 by the bit line spacer 309 and the air gap 315. The air gap 315 is capped by a capping spacer 316. The air gap 315 and the capping spacer 316 is formed by the above described with respect to FIGS. 1-6. The capping spacer 316 may corresponded to the second spacer 110, 211, 40 and the bit line spacer 309 may corresponded to the first spacer 109, 210, 35. Accordingly, the capping spacer 316 is formed over the trimmed sidewalls of the bit line hard mask 308.

A storage node 318 is formed over a storage node contact plug 311, and is connected to the active region 303 via the storage node contact plug 311.

FIGS. 9A to 9K illustrate a modification to the exemplary memory cells shown in FIGS. 8A-8C.

Figure 9A:
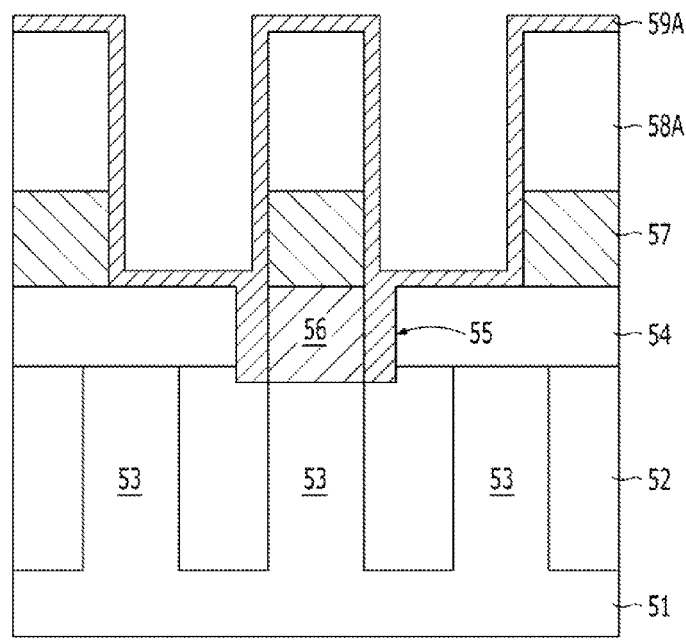
FIGS. 9A to 9K illustrate a method of fabricating the exemplary memory cells.

Referring to FIG. 9A, a substrate 51 may include, for example, silicon. The substrate 51 may include, for example, a silicon substrate, a silicon germanium substrate, or the like. Furthermore, the substrate 51 may include, for example, a silicon-on-insulator (SOI) substrate.

A device isolation region 52 is formed in a substrate 301. The device isolation region 52 is formed by a shallow trench isolation (STI) process. An active region 53 is defined by the device isolation region 52. The device isolation region 52 may formed by sequentially stacking a wall oxide, a liner, and a fill material. The liner may include, for example, a silicon nitride, a silicon oxide, or the like. The silicon nitride may include, for example, $SI_3N_4$, and the silicon oxide may include, for example, $SiO_2$. The fill material may include, for example, a silicon oxide, such as spin-on dielectric (SOD). Furthermore, the fill material may include, for example, a silicon nitride. In an alternative implementation, the liner may be entirely silicon nitride.

Although not illustrated, after forming the device isolation region 52, a buried gate electrode (reference numeral 322 shown in FIG. 8C) is formed. For example, after forming the trench by etching the active region 53 and the device isolation region 52, the buried gate electrode 322 is formed in the trench. Then, the sealing layer 323 is formed over the buried gate electrode 322. Before forming the buried gate electrode 322, the gate dielectric layer is formed along a surface defining the trench 320. The buried gate electrode 322 may formed by etching back a metal containing layer after the metal containing layer is formed to fill the trench 320. The metal-containing layer may include, for example, a metal, such as titanium, tantalum, tungsten, or the like. The metal-containing layer may include, for example, tantalum nitride (TaN), titanium nitride (TIN), tungsten nitride (WN), or tungsten (W). For example, the buried gate electrode 322 may have a single layer structure of TIN, TaN, or W, or a dual layer structure of TiN/W or TaN/W formed by stacking W over TiN or TaN. Furthermore, the buried gate electrode 323 may have a dual layer structure of WN/W in which W is stacked over WN. In addition, the buried gate electrode 322 may include, for example, a low-resistance metal material. The sealing layer may serve to protect the buried gate electrode 322 during a subsequent process. The sealing layer may include, for example, an insulating material. The sealing layer may include, for example, silicon nitride. After forming the sealing layer, source/drain regions is formed in the active region.

Referring back to FIG. 9A, a first interlayer insulation layer 54 is formed over the entire surface of the substrate 51. The first interlayer insulation layer 54 may include, for example, a silicon nitride, a silicon oxide, or the like. An etch stop layer (not shown) comprising silicon nitride is formed over the first interlayer insulation layer 54.

The first interlayer insulation layer 54 is etched to form a bit line contact hole 55 to expose a surface of a part of the substrate 51. A mask pattern (not shown) is used as an etch mask to form the bit line contact hole 55. After forming the bit line contact hole 55, the active region 53 is recessed in a certain depth. Thus, a contact area between the active region 53 and a bit line contact plug 56 formed in the bit line contact hole 55 may increase.

The bit line contact plug 56 is formed in the bit line contact hole 55. The bit line contact plug 56 is formed to fill the bit line contact hole 55. After a conductive layer (not shown) is formed over the entire surface of the resulting structure comprising the first interlayer insulation layer 54, a planarization process is performed on the conductive layer, thereby forming the bit line contact plug 56. The bit line contact plug 56 may include, for example, a polysilicon layer or a metal layer.

A bit line 57 and a bit line hard mask 58A may be formed over the bit line contact plug 56. In an alternative implementation if the bit line 57 and the bit line hard mask 58A are adjusted to have a width smaller than a width of the bit line contact hole 55, then the bit line contact plug 56 is etched. In this case, although sidewalls defining the bit line contact hole 55 are exposed as the bit line contact plug 56 is etched, the exposed sidewalls are filled by using a bit line spacer 59. The bit line 57 may include, for example, a metal-containing layer, such as tungsten. The bit line hard mask 58A may include, for example, a silicon nitride.

Although not illustrated, fabricating processes of the bit line contact plug 56, the bit line 57 and the bit line hard mask pattern 58A and the fabricating processes of gate structure of a transistor in a peripheral region may be simultaneously performed.

A bit line spacer 59A is formed over the entire surface of the resulting structure comprising the bit line hard mask pattern 58A. The bit line spacer 59A may be conformally formed. The bit line spacer 59A may include, for example, a silicon nitride. The silicon nitride may include, for example, a high density silicon nitride.

Figure 9B:
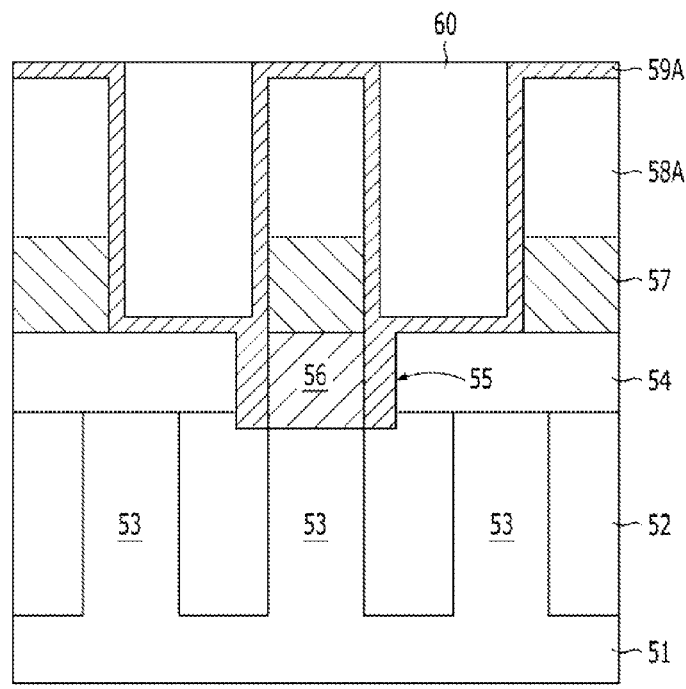

Referring to FIG. 9B, a second interlayer insulation layer 60 is formed over the bit line spacer 59A. The second interlayer insulation layer 60 is formed over the entire surface of the resulting structure comprising the bit line spacer 59A to fill spaces between the adjacent bit lines 57. The second inter-layer insulation layer 60 is planarized to expose the top surface of the bit line hard mask pattern 58A.

Figure 9C:
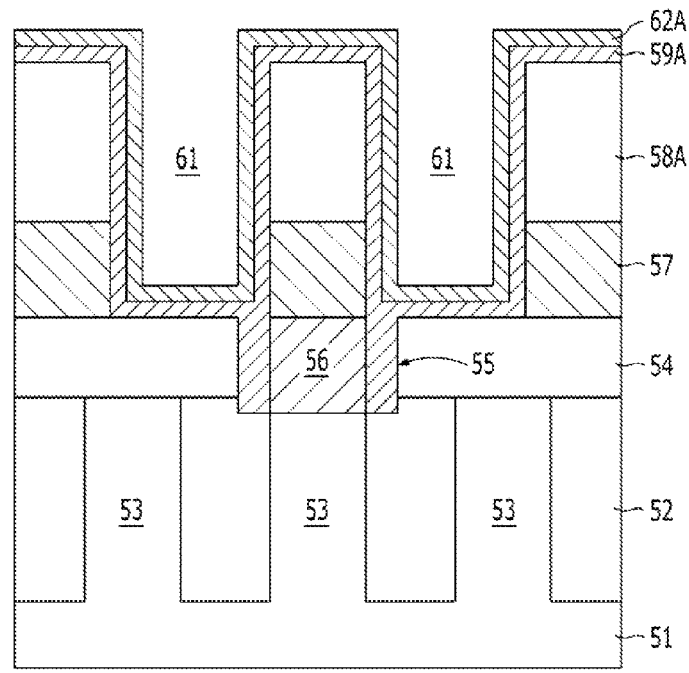

Referring to FIG. 9C, the second interlayer insulation layer 60 may be etched using a mask pattern (not shown) to form a storage node contact hole 61 is formed between the adjacent bit lines 57. The storage node contact hole 61 is self-aligned by the bit line spacer 59A formed over the bit line 57. Thus, a passivation spacer 59 is formed over sidewalls defining the storage node contact hole 61 that are exposed by the storage node contact hole 61. The bit line spacer 59A remains below the storage node contact hole 61.

A sacrificial layer 62A is formed over the entire surface of the resulting structure, including the storage node contact hole 61. The sacrificial layer 62A is formed at a temperature above at east 400° C. The dielectric constant of the sacrificial layer 62A has value between a dielectric constant of air and a dielectric constant of $SiO_2$. The sacrificial layer 62A may include, for example, a carbon-containing material. The sacrificial layer 62A may include, for example, an amorphous carbon.

Figure 9D:
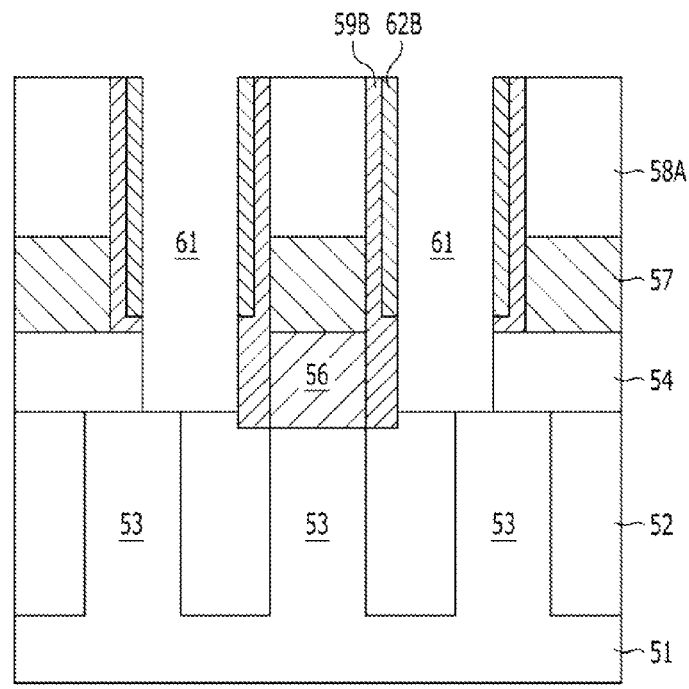

Referring to FIG. 9D, the sacrificial spacer 62B may be formed over the sidewalls that define the storage node contact hole 61 by etch back process of the sacrificial layer 62A.

The bit line spacer 59A exposed by the (26B) is etched to form a bit line spacer 59B The bit line spacer 59B is formed over the bit line 57 and the bit line hard mask pattern 58A. The bit line spacer 59B that is formed over the bit line hard mask pattern 58A is removed. The sacrificial spacer 62B is formed over the bit line spacer 59B. The sacrificial spacer 62B and the bit line spacer 59B form a dual spacer structure.

The first inter-layer insulation layer 54 exposed by the bit line spacer 59B is etched to enlarge the storage node contact hole 61 in a vertical direction. Thus, a surface of the substrate 51 is exposed.

Figure 9E:
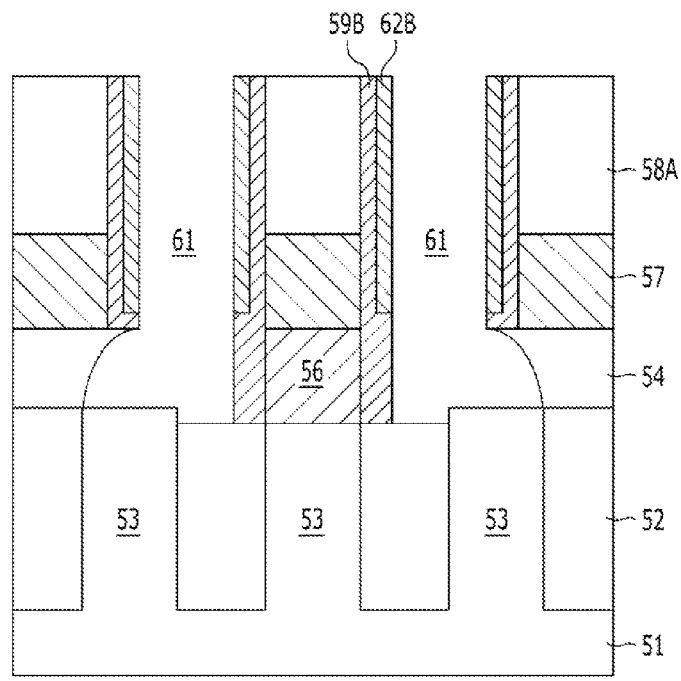

Referring to FIG. 9E, the first inter-layer insulation layer 54 is isotropically etched to enlarge a lower portion of the storage node contact holes 61 in a horizontal direction. When the first inter-layer insulation layer 54 is isotropically etched, the sacrificial spacer 62B and the bit line spacer 59B are used as a etch barrier layer. When the first inter-layer insulation layer 54 is isotropically etched, a part of the device isolation region 52 is etched.

Figure 9F:
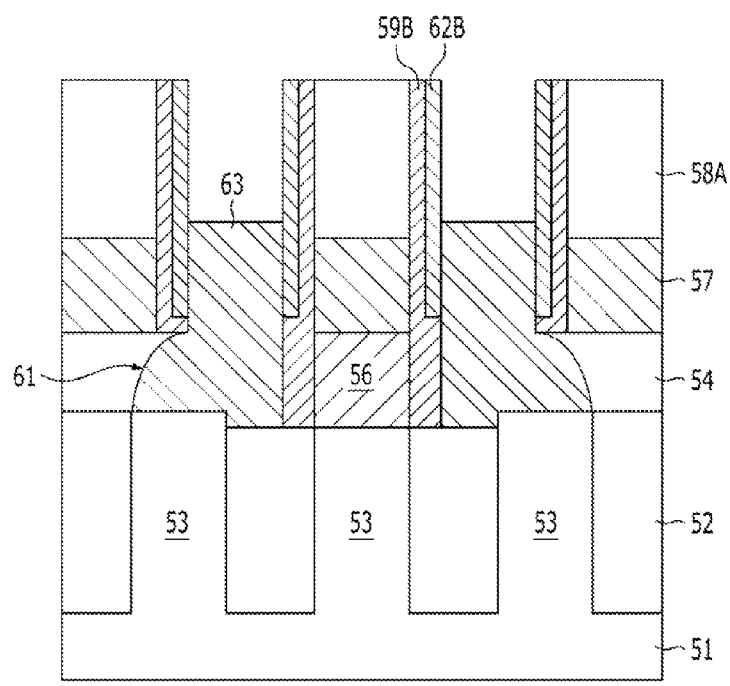

Referring to FIG. 9F, a first plug 63 is formed in the storage node contact hole 61. A conductive layer (not shown) is formed over the entire surface of the resulting structure to fill the storage node contact hole 61. The first plug 63 is formed by recessing the conductive layer. The first plug 63 may have a surface that is higher than a top surface of the bit line 57. The height of the surface of the first plug 63 is adjusted to minimize a facing area to the bit line 57. Accordingly, parasitic capacitance between the first plug 63 and the bit line 57 may be reduced. The first plug 63 may include, for example, a silicon or a metal. The first plug 63 may include, for example, polysilicon. The first plug 63 is formed at a temperature below at least 400° C. The top portion of the sacrificial spacer 62B is exposed after the first plug 63 is formed.

Figure 9G:
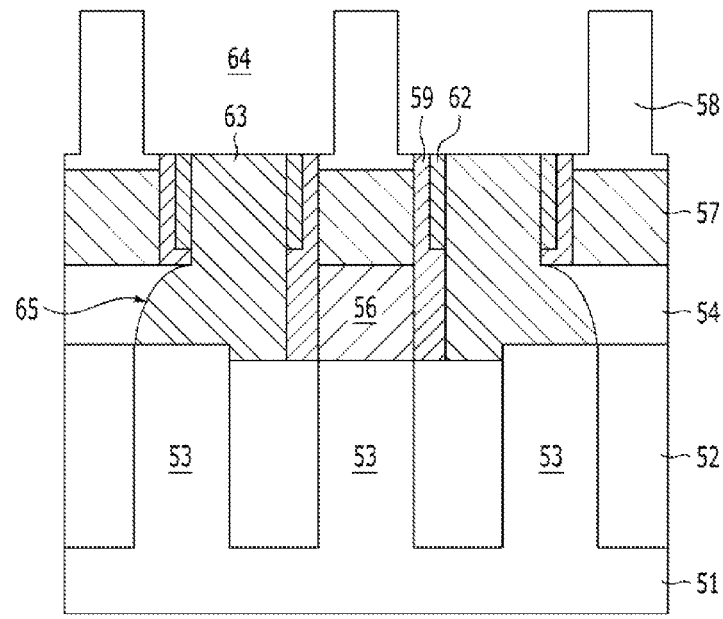

Referring to FIG. 9G, portions of the sacrificial spacer 62B and the bit line spacer 59B that extend above the first plug 63 may be removed by an isotropic etching process. The sacrificial spacer 62 is formed by the isotropic etching process of the sacrificial spacer 62BA top portion of the bit line spacer 59B, which is exposed by the removal of the sacrificial spacer 62, is selectively etched by an isotropic etching process to form a passivation spacer 59.

By using an isotropic etching process, a recessed plug structure including the sacrificial spacer 62, which surrounds the first plug 63, is formed. Upper surfaces of the passivation spacer 59 and the sacrificial spacer 62 are aligned to be substantially co-planar with an upper surface of the first plug 63.

Then, a trimming process is performed on the bit line hard mask pattern 58A. The trimming process may be performed by an isotropic etching process. The same isotropic etching process may be used to etch the bit line spacer 59B and trim the bit line hard mask pattern 58B.

The trimming process decreases a width of the bit line hard mask pattern 58 and increases a width of an upper portion of the storage node contact hole 61.

Similar to the second storage node contact hole 317 (as shown in FIGS. 8A and 8C) a second storage node contact hole 64 is formed by the trimming process of the bit line hard mask pattern 58. The storage node contact hole having the first plug 63 and the sacrificial spacer 62 is a first storage node contact hole 65. A width of the second storage node contact hole 64 may be greater than a width of the first storage node contact hole 65.

Figure 9H:
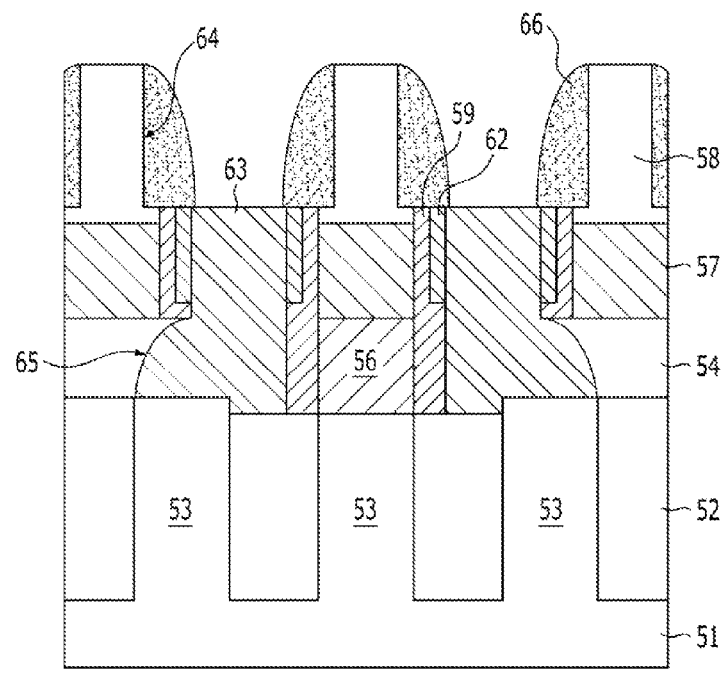
Figure 9I:
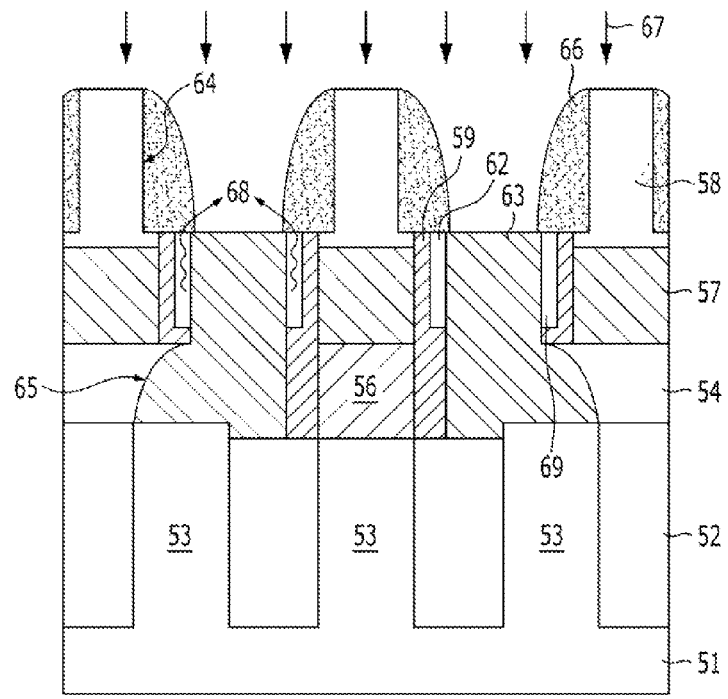
Figure 9J:
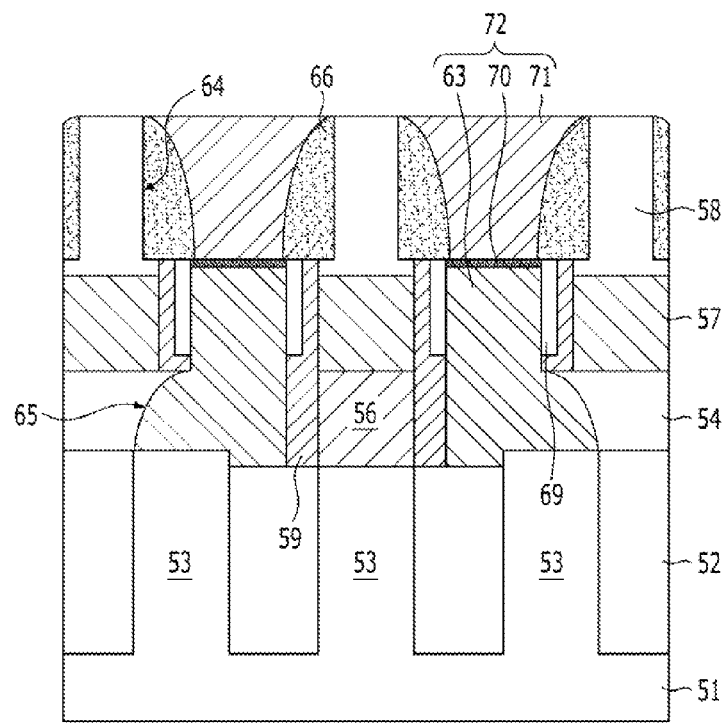

Referring to FIG. 9H, a capping spacer 66 is formed. A second insulation layer not shown) is conformally formed over the entire surface of the resulting structure, including the bit line hard mask pattern 58. Then, the second insulation layer may be etched to form the capping spacer 66. The capping spacer 66 may be formed by a dry etching process. For example, the dry etching process may include, for example, an etch back process. The capping spacer 66 is formed over the bit line hard mask pattern 58. The capping spacer 66 may include, for example, a material having a low dielectric constant. The capping spacer 66 may include, for example, a low density silicon oxide. The low density silicon oxide may be formed by a low temperature CVD. The capping spacer 66 may include, for example, a porous dielectric material. Since the capping spacer 66 is formed at a low temperature below at least 400° C. the second insulation layer has a low density. The capping spacer 66 may include, for example, a material having a low density and being capable of diffusing oxygen plasma from a plasma stripper.

The capping spacer 66 is formed over a third conductive pattern 44. The capping spacer 66 is formed to cap the upper portion of the sacrificial spacer 62 and to expose the upper portion of the first plug 63. That is, the capping spacer 66 is formed to cover the passivation spacer 59 and the sacrificial spacer 62 and to expose the upper portion of the first plug 63.

As described above, an air gap 69 is formed by removing the sacrificial spacer 62 by the conversion process 67. Since the air gap 69 is capped by the capping spacer 66, the air gap 69 is stably capped even though the sacrificial spacer 62 is removed. By forming the air gap 69, a parasitic capacitance between adjacent first plugs 63 may be decreased. The air gap 69 is formed to surround the first plug 63.

Referring to FIG. 93, a second plug 71 is formed over the first plug 63. The second plug 71 fills the second storage node contact hole 64. The second plug 71 may include, for example, a metal-containing layer. The second plug 71 may include, for example, a tungsten layer. The second plug 71 may include, for example, a stack of a titanium layer, a titanium nitride layer, and a tungsten layer. An ohmic contact layer 70 is formed between the first plug 63 and the second plug 71. The ohmic contact layer 70 may include, for example, a metal silicide. The ohmic contact layer 70 may include, for example, a cobalt silicide. To form the cobalt silicide, an annealing process may be performed after a cobalt layer is deposited over the first plug 63. Alternatively, cobalt silicide may be directly deposited over the first plug 63. The cobalt silicide may be simultaneously deposited between the first plug 63 and the second plug 71 and between the second plug 71 and the capping spacer 66. If the first plug 63 includes, for example, a silicon-containing layer, then and the second plug 71 may include, for example, a metal-containing layer. The first plug 63 and the second plug 71 are composed of a semi-metal plug structure.

As described above, when the second plug 71 is formed, the storage node contact plug 72 comprising the first plug 63, the ohmic contact layer 70 and the storage node contact plug 72. Accordingly, the air gap 69 is formed between the storage node contact plug 72 and the bit line 57. The air gap is capped by the capping spacer 66.

Figure 9K:
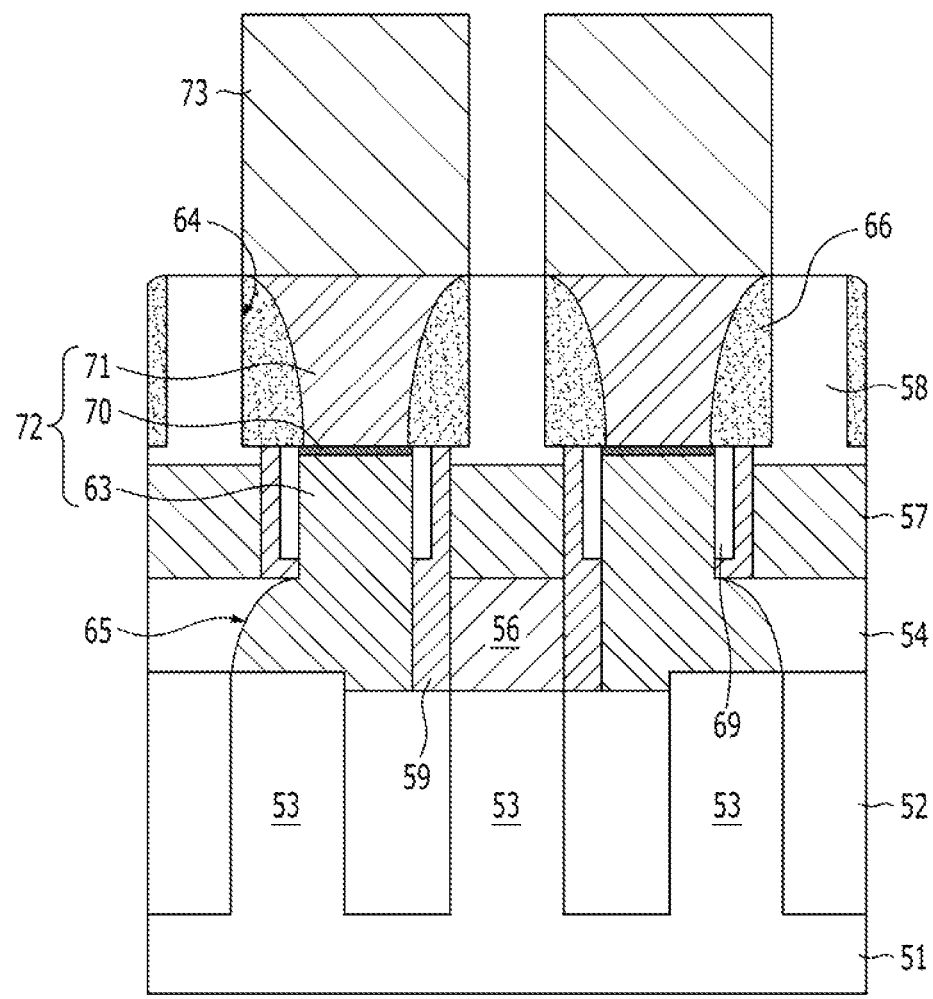

Referring to FIG. 9K, a storage node 73 is formed the storage node contact plug 72. Though not illustrated, a dielectric layer and a plate node is further formed over the storage node 73.

The exemplary semiconductor device may be applied to DRAM (Dynamic Random Access Memory). Without being limited thereto, however, the semiconductor device is applied to SRAM (Static Random Access Memory), flash memory, FeRAM (Ferroelectric Random Access Memory), MRAM (Magnetic Random Access Memory), PRAM (Phase Change Random Access Memory), or the like.

Figure 10:
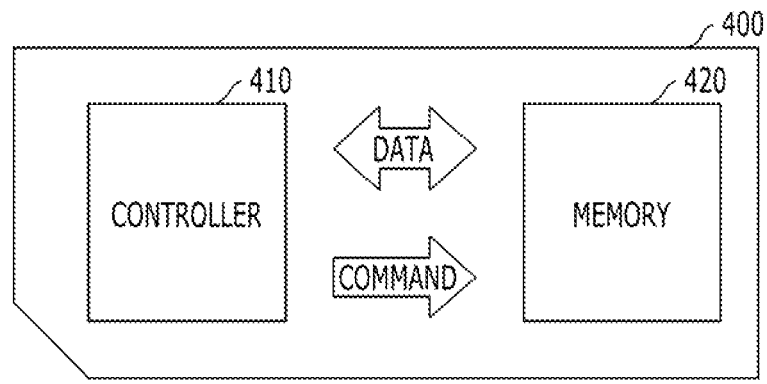
FIG. 10 is a schematic diagram of an exemplary memory card.

FIG. 10 is a schematic diagram of an exemplary memory card.

Referring to FIG. 10, the memory card 400 may include, for example, a controller 410 and a memory 420. The controller 410 and the memory 420 may exchange electrical signals. For example, the memory 420 and the controller 410 may exchange data according to a command of the controller 410. Accordingly, the memory card 400 may store data in the memory 420, or output data to the outside from the memory 420. The memory 420 may include, for example, the above-described air gap or the above-described carbon-containing spacer. The memory card 400 may be used, for example, as a data storage media of various portable devices. For example, the memory card 400 may include, for example, a memory stick card, a smart media card (SM), a secure digital card (SD), a mini secure digital card (min SD), or a multi-media card MMC).

Figure 11:
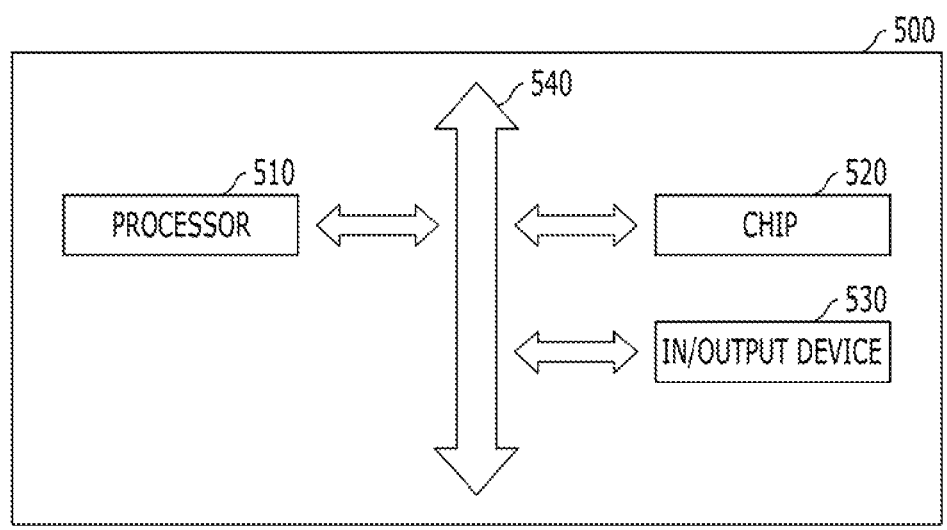
FIG. 11 is a block diagram illustrating an exemplary electronic system.

FIG. 11 is a block diagram illustrating an exemplary electronic system.

Referring to FIG. 14, the electronic system 500 may include, for example, a processor 510, an input/output device 530, and a chip 520, which perform data communication through a bus 540. The processor 510 serves to perform a program operation and control the electronic system 500. The input/output device 530 may be used to input or output data of the electronic system 500. The electronic system 500 may be connected to an external device, for example, a personal computer or network, and exchange data with the external device through the input/output device 530. The chip 520 may store codes and data for the operation of the processor 510, and may process a part of operations assigned by the processor 510. For example, the chip 520 may include, for example, the above-described air gap or carbon-containing spacer. The electronic system 500 may include various electronic control devices requiring the chip 520. For example, the electronic system 500 is used in a mobile phone, an MP3 player, a navigation system, a solid state disk (SSD), or a household appliance.

Although various exemplary implementations of the have been described for illustrative purposes, it will be apparent to those skilled in the art that various changes and modifications is made without departing from the spirit and scope of the invention as defined in the following claims.

What is claimed is:

1. A method for fabricating a semiconductor device, the method comprising:
    form a stack conductive structure by stacking a first conductive pattern and an insulation pattern over a substrate;
    forming a sacrificial pattern over sidewalls of the stack conductive structure;
    forming a second conductive pattern having a recessed surface lower than a top surface of the stack conductive structure;
    forming a sacrificial spacer to expose sidewalls of the insulation pattern by removing an upper portion of the sacrificial pattern;
    reducing a width of the exposed portion of the insulation pattern;
    forming a capping spacer to cap the sidewalls of the insulation pattern having the reduced width over the sacrificial spacer; and
    forming an air gap between the first conductive pattern and the second conductive pattern by converting the sacrificial spacer to volatile byproducts.

2. The method of claim 1, wherein the converting the sacrificial spacer to a diffusible state is performed by decomposing or phase changing the sacrificial spacer.

3. The method of claim 1, wherein the converting the sacrificial spacer to a diffusible state is performed by performing an oxidation plasma treatment.

4. The method of claim 1, wherein the converting the sacrificial spacer to a diffusible state is performed by converting the sacrificial spacer to a vapor or gas by an oxidation reaction process.

5. The method of claim 1, wherein the sacrificial spacer includes a carbon-containing material.

6. The method of claim 1, wherein the capping spacer includes an insulation material having a density that is sufficiently low as to allow the converted sacrificial spacer to diffuse through the capping spacer.

7. The method of claim 1, wherein the capping spacer includes silicon oxide.

8. The method of claim 1, wherein after the forming of the stack conductive structure, further comprises:
    forming a passivation spacer over sidewalls of the conductive structure, wherein the passivation spacer is formed of silicon nitride.

9. The method of claim 8, wherein the passivation spacer includes an insulation material having a density that is sufficiently high as to prevent the converted sacrificial spacer from diffusing through the passivation spacer.

10. The method of claim wherein, after the forming an air gap, the method further comprises:
    forming a ohmic contact layer over the second conductive pattern; and
    forming a third conductive pattern over the ohmic contact layer.

* * * * *